(12) United States Patent
Oh et al.

(10) Patent No.: US 11,069,588 B2
(45) Date of Patent: Jul. 20, 2021

(54) SEMICONDUCTOR PACKAGE AND METHOD OF MANUFACTURING THE SAME

(71) Applicant: Samsung Electronics Co., Ltd., Suwon-si (KR)

(72) Inventors: Jun-young Oh, Seoul (KR); Hyun-ki Kim, Asan-si (KR); Sang-soo Kim, Cheonan-si (KR); Seung-hwan Kim, Asan-si (KR); Yong-kwan Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/357,732

(22) Filed: Mar. 19, 2019

(65) Prior Publication Data
US 2020/0043820 A1 Feb. 6, 2020

(30) Foreign Application Priority Data

Aug. 1, 2018 (KR) .................. 10-2018-0090056

(51) Int. Cl.
*H01L 23/29* (2006.01)
*H01L 21/56* (2006.01)
(Continued)

(52) U.S. Cl.
CPC .......... *H01L 23/295* (2013.01); *H01L 21/561* (2013.01); *H01L 21/565* (2013.01);
(Continued)

(58) Field of Classification Search
CPC . H01L 23/291; H01L 23/295; H01L 23/3114; H01L 23/3128; H01L 23/5283; H01L 24/09
See application file for complete search history.

(56) References Cited

U.S. PATENT DOCUMENTS 5,907,190 A 5/1999 Ishikawa et al.
7,781,876 B2 8/2010 Theuss et al.
(Continued)

FOREIGN PATENT DOCUMENTS

DE 102007017641 A1 10/2008
EP 2277179 A1 1/2011
(Continued)

OTHER PUBLICATIONS

European Search Report dated Jul. 30, 2019, issued in corresponding European Patent Application No. 19164082.0.
(Continued)

*Primary Examiner* — Nathan W Ha
(74) *Attorney, Agent, or Firm* — Harness, Dickey & Pierce, P.L.C.

(57) ABSTRACT

A semiconductor package includes a package substrate, at least one semiconductor chip mounted on the package substrate, and a molding member that surrounds the at least one semiconductor chip. The molding member includes fillers. Each of the fillers includes a core and a coating layer that surrounds the core. The core includes a non-electromagnetic material and the coating layer includes an electromagnetic material. The molding member includes regions respectively have different distributions of the fillers.

16 Claims, 18 Drawing Sheets

(51) Int. Cl.
*H01L 23/31* (2006.01)
*H01L 23/528* (2006.01)
*H01L 23/00* (2006.01)

(52) U.S. Cl.
CPC ........ *H01L 23/291* (2013.01); *H01L 23/3114* (2013.01); *H01L 23/3128* (2013.01); *H01L 23/5283* (2013.01); *H01L 24/09* (2013.01); *H01L 24/17* (2013.01); *H01L 24/97* (2013.01)

(56) References Cited

U.S. PATENT DOCUMENTS

| | | | | |
|---|---|---|---|---|
| 7,898,093 | B1* | 3/2011 | Darveaux | H01L 23/562 257/787 |
| 8,198,141 | B2 | 6/2012 | Ito et al. | |
| 9,837,335 | B2 | 12/2017 | Matsubara | |
| 2004/0150079 | A1 | 8/2004 | Jiang et al. | |
| 2005/0087891 | A1 | 4/2005 | Rumer et al. | |
| 2010/0244224 | A1 | 9/2010 | Tanaka et al. | |
| 2011/0133327 | A1* | 6/2011 | Hsu | H01L 21/563 257/692 |
| 2011/0152008 | A1* | 6/2011 | Kim | B29C 45/16 473/373 |
| 2012/0193662 | A1* | 8/2012 | Donofrio | H01L 33/60 257/98 |
| 2013/0034739 | A1* | 2/2013 | Boday | C09K 5/08 428/447 |
| 2013/0299981 | A1 | 11/2013 | Maohua | |
| 2014/0091454 | A1* | 4/2014 | Lin | H01L 23/3121 257/734 |
| 2014/0367841 | A1 | 12/2014 | Huang et al. | |
| 2015/0371916 | A1* | 12/2015 | Barr | H01L 24/29 438/127 |
| 2016/0005707 | A1* | 1/2016 | Kwon | H01L 25/0657 257/737 |
| 2016/0079135 | A1* | 3/2016 | Huang | H01L 25/0655 257/777 |
| 2016/0093780 | A1* | 3/2016 | Beppu | H01L 33/60 257/98 |
| 2017/0170095 | A1* | 6/2017 | Matsubara | H01L 23/295 |
| 2017/0330657 | A1 | 11/2017 | Arnold et al. | |
| 2017/0338164 | A1* | 11/2017 | Koerner | H01L 23/49582 |
| 2018/0005917 | A1* | 1/2018 | Tang | H01L 23/3733 |
| 2018/0073165 | A1 | 3/2018 | Laidmae et al. | |
| 2018/0082961 | A1 | 3/2018 | Yew et al. | |
| 2018/0294210 | A1* | 10/2018 | Schindler | H01L 23/562 |
| 2018/0374799 | A1 | 12/2018 | Kawabata | |
| 2019/0115305 | A1* | 4/2019 | Lin | H01L 23/5386 |
| 2019/0139851 | A1* | 5/2019 | Myung | H01L 23/291 |
| 2019/0184729 | A1* | 6/2019 | Zhou | B41J 3/407 |
| 2020/0043820 | A1* | 2/2020 | Oh | H01L 23/3128 |
| 2020/0144236 | A1* | 5/2020 | Jang | H01L 24/09 |
| 2020/0212006 | A1* | 7/2020 | Chang | H01L 25/50 |

FOREIGN PATENT DOCUMENTS

| | | |
|---|---|---|
| JP | H03171654 A | 7/1991 |
| JP | 5579982 B2 | 8/2014 |
| JP | 6213128 B2 | 10/2017 |
| KR | 10-2014-0074026 A | 6/2014 |
| KR | 10-2014-0081548 A | 7/2014 |
| KR | 10-2017-0069916 A | 6/2017 |

OTHER PUBLICATIONS

Yang et. al 'Systems of mechanized and reactive droplets powered by multi-resposive surfactants' pp. 1-6 2018.

* cited by examiner

SEMICONDUCTOR PACKAGE AND METHOD OF MANUFACTURING THE SAME

CROSS-REFERENCE TO RELATED APPLICATION

This application claims the benefit of Korean Patent Application No. 10-2018-0090056, filed on Aug. 1, 2018, in the Korean Intellectual Property Office, the disclosure of which is incorporated herein in its entirety by reference.

BACKGROUND

Inventive concepts relate to a semiconductor package and a method of manufacturing the same, and more particularly, a semiconductor package that includes a molding member surrounding a semiconductor chip and a method of manufacturing the same.

Nowadays, as demand on portable devices in the electronic product market has been rapidly increasing, there have been continuous requirements for small sizes and light weights of electronic components mounted on electronic products. For small sizes and light weights of electronic components, decreased sizes and capability of processing high capacity data are required by a semiconductor package loaded in the electronic components. Semiconductor chips loaded in such semiconductor packages are covered by being surrounded by molding members. In general, positions of fillers included in a molding member are fixed when the materials are randomly mixed, and thus, it is very difficult to selectively change the positions of the fillers in the molding member according to a type of a semiconductor package.

SUMMARY

Inventive concept provide, to efficiently protect semiconductor chips in a semiconductor package structure, a semiconductor package in which positions of fillers may be controlled in a molding member by using an electric field and/or a magnetic field.

Inventive concepts also provide, to efficiently protect semiconductor chips in a semiconductor package structure, a method of manufacturing a semiconductor package in which positions of fillers may be controlled in a molding member by using an electric field and/or a magnetic field.

Features and effects of inventive concepts are not limited to those described above, and other features and effects may be clearly understood to one of ordinary skill in the art by descriptions below.

According to an aspect of inventive concepts, a semiconductor package includes a package substrate, at least one semiconductor chip mounted on the package substrate, and a molding member that surrounds the semiconductor chip and including fillers. Each of the fillers includes a core and a coating layer that surrounds the core. The core includes a non-electromagnetic material and the coating layer includes an electromagnetic material. The molding member includes regions that respectively have different distributions of the fillers.

According to another aspect of inventive concepts, a semiconductor package includes a package substrate, at least one semiconductor chip mounted on the package substrate, and a molding member that surrounds the semiconductor chip. The molding member includes fillers distributed in an epoxy material. Each of the fillers includes a core and a coating layer that covers the core. The core is a non-electromagnetic material and the coating layer is an electromagnetic material. The fillers are configured to be moved in a certain direction in the molding member by an electric field or a magnetic field that may be applied to the molding member, and the molding member includes regions respectively having different distributions of the fillers.

According to another aspect of inventive concepts, a method of manufacturing a semiconductor package includes mounting at least one semiconductor chip on a package substrate, coating a molding material including fillers on the package substrate to surround the at least one semiconductor chip, moving the fillers in a certain direction in the molding material by applying an electric field or a magnetic field to the molding material, and forming a molding member by curing the molding material. The fillers each include a core and a coating layer that surrounds the core. The core is a non-electromagnetic material, and the coating layer is an electromagnetic material that surrounds the core.

BRIEF DESCRIPTION OF THE DRAWINGS

Embodiments of inventive concepts will be more clearly understood from the following detailed description taken in conjunction with the accompanying drawings in which.

DETAILED DESCRIPTION

Hereinafter, embodiments of inventive concepts will be described in detail with reference to attached drawings.

Figure 1:
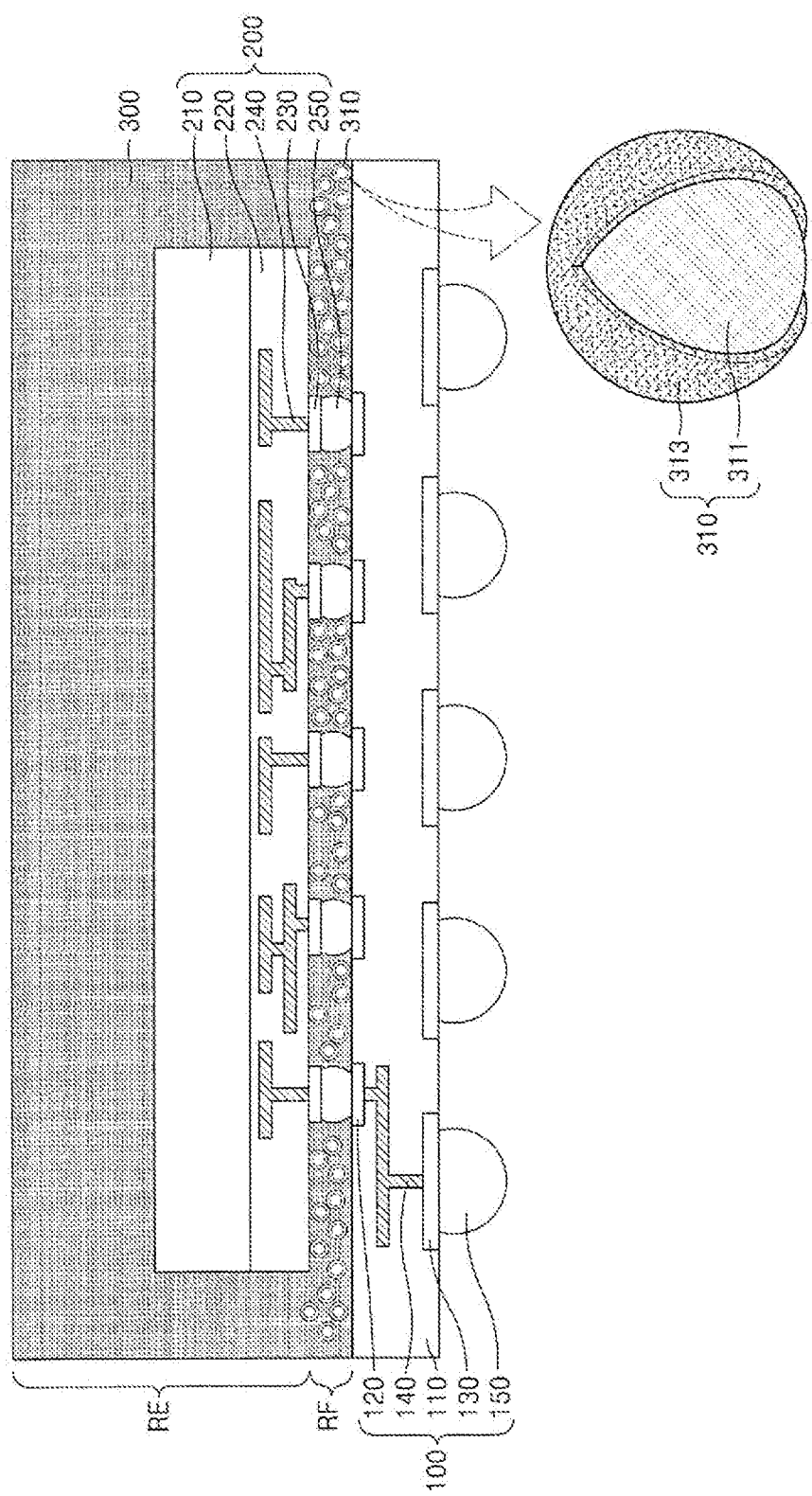
FIG. 1 is a cross-sectional view of a semiconductor package according to an embodiment.

FIG. 1 is a cross-sectional view of a semiconductor package 10 according to an embodiment of inventive concepts.

Referring to FIG. 1, the semiconductor package 10 includes a package substrate 100, a semiconductor chip 200 mounted on the package substrate 100, and a molding member 300 that surrounds the semiconductor chip 200.

The package substrate 100, which is a supporting substrate, may include a body 110, a lower protection layer, and an upper protection layer. The package substrate 100 may be formed based on a printed circuit board (PCB), a wafer substrate, a ceramic substrate, a glass substrate, an interposer substrate, and the like. In an embodiment according to inventive concepts, the package substrate 100 may be a PCB. However, the package substrate 100 is not limited to a PCB.

Meanwhile, an interconnect 140 is formed in the package substrate 100, and the interconnect 140 may be electrically connected to the semiconductor chip 200 via at least one of a pillar structure, a solder bump, a solder ball, and a solder layer connected to an upper electrode pad 120 in an upper surface of the package substrate 100.

In addition, an external connection terminal 150 may be placed at a lower electrode pad 130 in a lower surface of the package substrate 100. The package substrate 100 may, via the external connection terminal 150, be connected to a module substrate of an electronic device or a system board, via electrical connection.

The interconnect 140 is multi-layered or single-layered and may be formed in the body 110, and the external connection terminal 150 and the semiconductor chip 200 may be electrically connected to each other via the interconnect 140. The lower protective layer and the upper protective that protect the body 110 may, for example, include solder resist.

When the package substrate 100 is a PCB, the body 110 may generally be implemented by compressing a high-molecular material such as a thermosetting resin, an epoxy-based resin such as flame retardant 4 (FR-4), bismaleimide triazine (BT), and Ajinomoto Build up Film (ABF) in a certain thickness and forming the above-mentioned material, which is compressed, into a foil shape, coating copper foils on two surfaces of the foil shape, and forming, via patterning, the interconnect 140 that is a transmission path of electrical signals. Except for regions connected to terminals (the external connection terminals 150 and internal connection terminals 250), for example, the upper electrode pads 120 and the lower electrode pads 130, solder resist may be coated on the lower surface and the upper surface of the body 110, and thus, the lower protective layer and the upper protective layer may be implemented.

A PCB may be classified into a single layer PCB in which the interconnect 140 is formed only in one surface of the PCB, and a double layer PCB in which the interconnect 140 is formed in two surfaces of the PCB. In addition, by using an insulator named prepreg, the copper foil may be designed to have at least three layers, and by forming at least three interconnects 140 according to the numbers of layers in the copper foil, a multi-layer PCB may be implemented. The package substrate 100 is not limited to the structure or materials of the PCB that is described above.

The semiconductor package 10 may have a structure in which the semiconductor chip 200 is mounted on the package substrate 100. Although FIG. 1 shows the embodiment in which only one semiconductor chip 200 is mounted on the package substrate 100, a plurality of semiconductor chips 200 may be mounted on the package substrate 100.

The semiconductor chip 200 may be a memory chip or a logic chip.

The memory chip may be a volatile memory chip or a non-volatile memory chip. The volatile memory chip may include existing volatile memory chips, for example, dynamic random access memory (DRAM), static RAM (SRAM), thyristor RAM (TRAM), zero capacitor RAM (ZRAM), or twin transistor RAM (TTRAM), and volatile memory chips which are under development. The non-volatile memory chips may include existing non-volatile memory chips, for example, flash memory, magnetic RAM (MRAM), spin-transfer torque MRAM (SST-MRAM), ferroelectric RAM (FRAM), phase change RAM (PRAM), resistive RAM (RRAM), nanotube RRAM, polymer RAM, nano floating gate memory, holographic memory, molecular electronics memory, or insulator resistance change memory, and non-volatile memory chips under development.

The logic chip may be implemented, for example, as a microprocessor, a graphics processor, a signal processor, a network processor, a chipset, an audio codec, a video codec, an application processor, or a system on chip (SoC), but the logic chip is not limited thereto. The microprocessor may, for example, include a single-core or a multi-core processor.

The semiconductor chip 200 may include a semiconductor substrate 210, a semiconductor device layer 220, lower connection pads 230, a semiconductor interconnect layer 240, and internal connection terminals 250.

The semiconductor chip 200 may, in the semiconductor substrate 210, have an active surface and an inactive surface that faces the active surface. The active surface in the semiconductor substrate 210 may be a surface that faces an upper surface of the package substrate 100. A plurality of active/passive elements and the lower connection pads 230 may be formed in the active surface of the semiconductor substrate 210.

The internal connection terminals 250 may be formed between the package substrate 100 and the active surface of the semiconductor chip 200. The internal connection terminals 250 may respectively contact the lower connection pads 230. The semiconductor chip 200 may be electrically connected to the package substrate 100 via the internal connection terminals 250.

The semiconductor substrate 210 may include the semiconductor device layer 220 that is formed at the active surface of the semiconductor substrate 210. The semiconductor interconnect layer 240 may be formed in the semiconductor device layer 220 and electrically connected to the internal connection terminals 250 via the lower connection pads 230.

The semiconductor substrate 210 may, for example, include silicon. Alternatively, the semiconductor substrate 210 may include a semiconductor element such as germanium or a compound semiconductor like silicon carbide (SiC), gallium arsenide (GaAs), indium arsenide (InAs), and indium phosphide (InP). Alternatively, the semiconductor substrate 210 may have a silicon on insulator (SOI) structure. For example, the semiconductor substrate 210 may include a buried oxide (BOX) layer. The semiconductor substrate 210 may include a conductive region, for example, a well doped with an impurity or a structure doped with an impurity. In addition, the semiconductor substrate 210 may have various device isolation structures like a shallow trench isolation (STI) structure.

The semiconductor device layer 220 may include the semiconductor interconnect layer 240 that is used for connecting a plurality of individual devices to other interconnects formed in the semiconductor substrate 210. The semiconductor interconnect layer 240 may include at least one metal interconnect layer and at least one via plug. For example, the semiconductor interconnect layer 240 may have a multi-layer structure in which at least two metal interconnect layers or at least two via plugs are alternately stacked.

The lower connection pads 230 may be placed on the semiconductor device layer 220 and electrically connected to the semiconductor interconnect layer 240 in the semiconductor device layer 220. The semiconductor interconnect layer 240 may be electrically connected to the internal connection terminals 250 via the lower connection pads 230.

The lower connection pads 230 may, for example, include at least one of Al, Cu, Ni, W, Pt, and Au.

A passivation layer may be formed on the semiconductor device layer 220 to protect the semiconductor interconnect layer 240 on the semiconductor device layer 220 and another structure placed therebelow from external shocks or moisture. The passivation layer may expose at least a part of an upper surface of the lower connection pad 230.

The internal connection terminals 250 may be respectively placed on the lower connection pads 230. The internal connection terminals 250 may be used for electrically connecting the semiconductor chip 200 to the package substrate 100. Via the internal connection terminals 250, at least one of a control signal, a power signal, and a ground signal, which are signals for operations of the semiconductor chip 200, may be provided from outside, a data signal that is to be stored in the semiconductor chip 200 may be provided from the outside, or data stored in the semiconductor chip 200 may be provided to the outside. The internal connection terminal 250 may, for example, include at least one of a pillar structure, a solder bump, a solder ball, and a solder layer.

The molding member 300 may be formed to surround sides, a lower surface, and an upper surface of the semiconductor chip 200. However, unlike as shown in FIG. 1, the upper surface of the semiconductor chip 200 may be exposed via the upper surface of the molding member 300.

The molding member 300 may, for example, be formed of epoxy molding compound. Epoxy molding compound may have a Young's Modulus from about 15 GPa to about 30 GPa and a coefficient of thermal expansion from about 3 ppm to about 30 ppm.

The molding member 300 is not limited to an epoxy molding compound and may also include various materials, for example, an epoxy material, a thermosetting material, a thermoplastic material, a UV-processed material, and the like. The thermosetting material may include a phenol type, an anhydride type, an amine type of curing agent and an acrylic polymer additive.

Meanwhile, the molding member 300 may be formed by using a molded underfill (MUF) process, and accordingly, a material covering an outer profile of the semiconductor chip 200 may be equal to a material that fills a region between the semiconductor chip 200 and the package substrate 100. As shown, the internal connection terminals 250 may be placed between the semiconductor chip 200 and the package substrate 100 and the molding member 300 may surround the internal connection terminals 250.

For the molding member 300, an appropriate amount of molding material is injected onto the package substrate 100 by an injection process, and an outer shape of the semiconductor package 10 is formed by a curing operation. As needed, in a pressurization process, such as a press, the molding material may be pressed to form the outer shape of the semiconductor package 10. In this case, process conditions such as a delay time between injection of the molding material and pressurization, an amount of the molding material that is injected, and pressurization temperature/pressure may be set considering a physical characteristic, for example, viscosity of the molding material.

A side and the top surface of the molding member 300 may have the form of a right angle which has an angle of about 90 degrees. In a process of cutting the package substrate 100 along dicing lines to make the semiconductor packages 10, the side and the upper surface of the molding member 300 generally form a right angle. Although not shown, a marking pattern including data of the semiconductor chip (e.g., a bar code, a number, a character, a symbol, or the like) may be formed at a region of a side of the semiconductor package 10.

The molding member 300 may protect the semiconductor chip 200 from external influences such as contamination and impacts. To do so, the molding member 300 may have a thickness which may, at least, completely surround the semiconductor chip 200. As the molding member 300 completely surrounds the semiconductor chip 200, a width of the molding member 300 may substantially be equal to a width of the semiconductor package 10.

In addition, the molding member 300, which is formed of epoxy molding compound, may include a large amount of fillers 310 in the epoxy molding compound. The fillers may be spherical. For example, the molding member 300 may be formed from an epoxy material including at least from about 50 wt % to about 90 wt % of the filler 310. In this case, the filler 310 may be configured to have silica, which is a kind of silicon oxide, or an aluminum oxide-based material, as a core, and to include a coating layer 313 that surrounds the core 311.

In an embodiment according to inventive concepts, the filler 310 may include a core, which is a non-electromagnetic material, and a coating layer 313 which is an electromagnetic material that surrounds the core 311. The filler 310 may, to react to an electric field or a magnetic field, have the form of a sphere, a platelet, or a fiber, which are made by coating a metal, a metal oxide, a carbon material, a functional polymer, and the like. According to directions of the electric field or the magnetic field that is applied to the molding member 300, flow and distribution of the filler 310 may be changed into desired directions.

In an embodiment according to inventive concepts, the molding member 300 may be employed as long as the molding member 300 includes the fillers 310, regardless of the form of the molding member 300 such as powder, a granule, liquid, or a sheet.

More particularly, the coating layer 313 may include one of a metal, a metal oxide, a polymer, a polymer electrolyte, and a carbon composition material, and the coating layer 313 may be formed into a target structure by using a publicly known method such as a sol-gel method, a co-precipitation method, a thermal spray method, an emulsion method, a hydrothermal synthesis method, or a spray drying method.

The coating layer 313 may be formed from different materials according to a type of an external force applied to the molding member 300. In some embodiments, the coating layer 313 may include one of a polymer, a polymer electrolyte, and a carbon composite material, which are materials reacting with the electric field. In other embodiments, the coating layer 313 may include one of a metal and a metal oxide which are materials reacting to the magnetic field.

Here, a case in which the coating layer 313 is formed from a material responding to the magnetic field is described in detail. The material that is included in the coating layer 313 and responds to the magnetic field may be construed not only as a material that has magnetism like a magnetic material that is magnetized but also as particles, such as iron or iron oxide, which are magnetized by the magnetic field and attracted to the magnetic field.

The coating layer 313 may be a powder particle that is formed of a ferromagnetic material, a soft magnetic material, or a paramagnetic material. The coating layer 313 may, for example, be iron oxide (FeO, $Fe_2O_3$, $Fe_2O_4$, $Fe_3O_4$), powder of ferrite materials such as Ni—Zn ferrite or Mn—Zn ferrite, permalloy, or sendust, and may include metal powder like nickel (Ni), zinc (Zn), manganese (Mn), cobalt (Co), magnesium (Mg), aluminum (Al), barium (Ba), copper (Cu), or iron (Fe). Alternatively, a mixture of ferrite powder and metal powder may be used for the coating layer 313.

Particles of the material included in the coating layer 313 may have a granular structure of about 1 μm, several μms, or tens of μms.

In the molding member 300, a region in which distribution of the fillers 310 is relatively high may be referred to as a filler dense layer RF, and a region in which distribution of the fillers 310 is relatively low may be referred to as an epoxy dense layer RE.

By using the electric field or the magnetic field, the fillers 310 may be controlled to be distributed in a localized region of the molding member 300 in a higher density than in other regions in the molding member 300. As shown, the filler dense layer RF may be formed such that the fillers 310 are placed around the internal connection terminals 250 and have a relatively high distribution in a region between the semiconductor chip 200 and the package substrate 100.

During or after a process of forming the molding member 300 including the fillers 310, to surround the semiconductor chip 200, the fillers 310 may be transmitted in a target direction in the molding member 300 by applying an electric field or a magnetic field to the molding member 300.

The electric field unit 420 (see FIG. 8A) and/or the magnetic field unit 430 (see FIG. 8A) may be placed at the upper region or the lower region of the molding member 300, and details thereof will be described hereinafter. In this case, the fillers 310 may be moved in a certain direction in the molding member 300 by the electric field that is formed by the electric field unit 420 (see FIG. 8A) or the magnetic field that is formed by the magnetic field unit 430 (see FIG. 8A). Accordingly, as shown in FIG. 1, the filler dense layer RF may be formed in the lower region of the molding member 300, and the epoxy dense layer RE may be formed in the upper region of the molding member 300.

Positions of the filler dense layer RF and the epoxy dense layer RE may be fixed by curing the molding member 300. The curing may be thermosetting or photo-curing. The molding member 300 that is cured loses fluidity, and the positions of the filler dense layer RF and the epoxy dense layer RE may be maintained when the electric field unit 420 (see FIG. 8A) and the magnetic field unit 430 (see FIG. 8A) are removed.

Nowadays, as demand on portable devices in the electronic product market has been rapidly increasing, there have been continuous requirements for small sizes and light weights of electronic components loaded in electronic products. For small sizes and light weights of the electronic components, decreased sizes and capability of processing high capacity data are required by a semiconductor package loaded in the electronic components. Implementing high capacity memory in a limited structure of a semiconductor package requires a small thickness of semiconductor chip stack, and therefore, thicknesses of semiconductor packages are steadily decreasing. Semiconductor chips loaded in such semiconductor packages are protected by being surrounded by molding members.

In a common semiconductor package, which is different from the semiconductor package 10 according to inventive concepts, positions of fillers included in a molding member are fixed in a randomly mixed state, and accordingly, it is very difficult to selectively change the positions of the fillers in the molding member according to the type of the semiconductor package.

On the other hand, in the semiconductor package 10 according to inventive concepts, fillers 310 may be distributed in the molding member 300, and in the process of forming the molding member 300, the filler dense layer RF, which is a layer made by the fillers 310 placed in a high distribution, may be induced in a localized region of the molding member 300 by applying an electric field or a magnetic field to the molding member 300 that is maintained to be a fluid state or a liquid fluid state. Next, by curing the molding member 300 that has fluidity, the filler dense layer RF may be fixed in the molding member 300, in a state of having fluidity.

In other words, in the semiconductor package 10 according to inventive concepts, positions of the fillers in the molding member 300 may be controlled by using the electric field or the magnetic field, and the semiconductor chips may be stacked in a small thickness, and as a result, a semiconductor package appropriate for high integration may be implemented.

Figure 2:
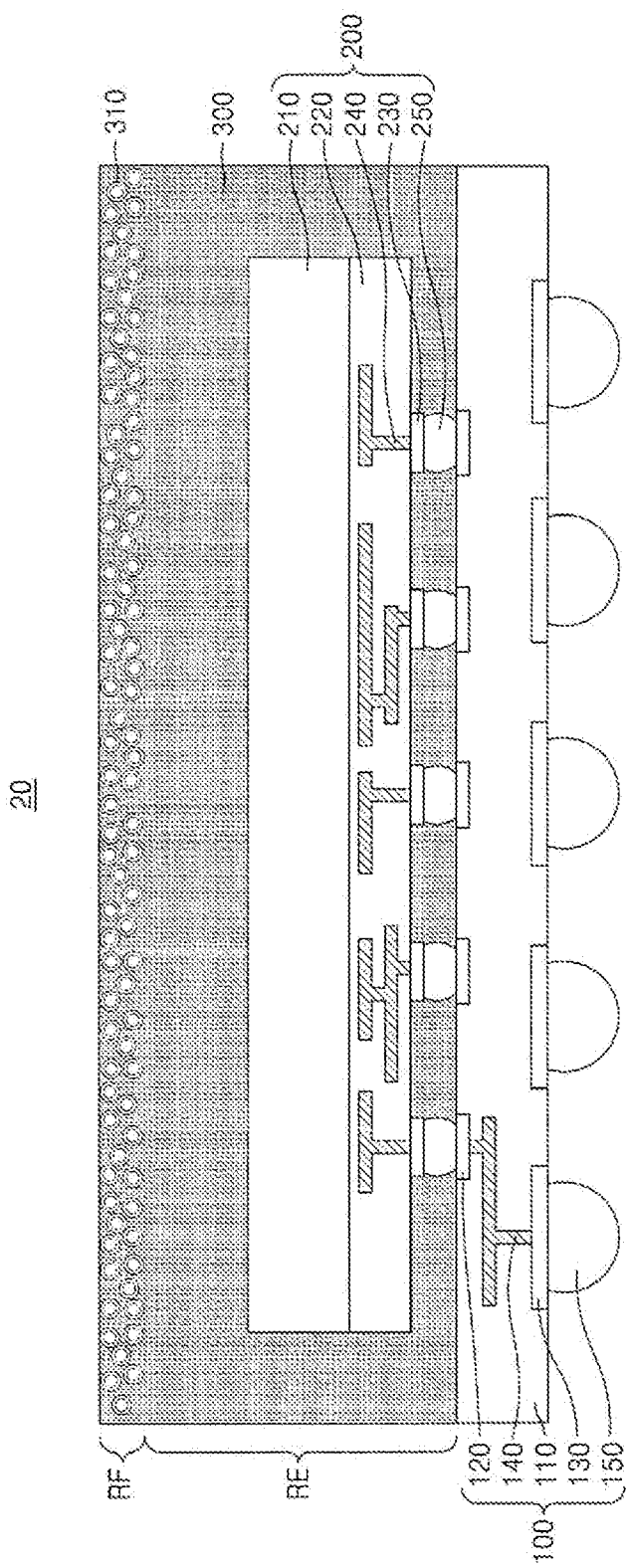
FIGS. 2 through 4 are cross-sectional views respectively showing semiconductor packages according to other embodiments.
Figure 3:
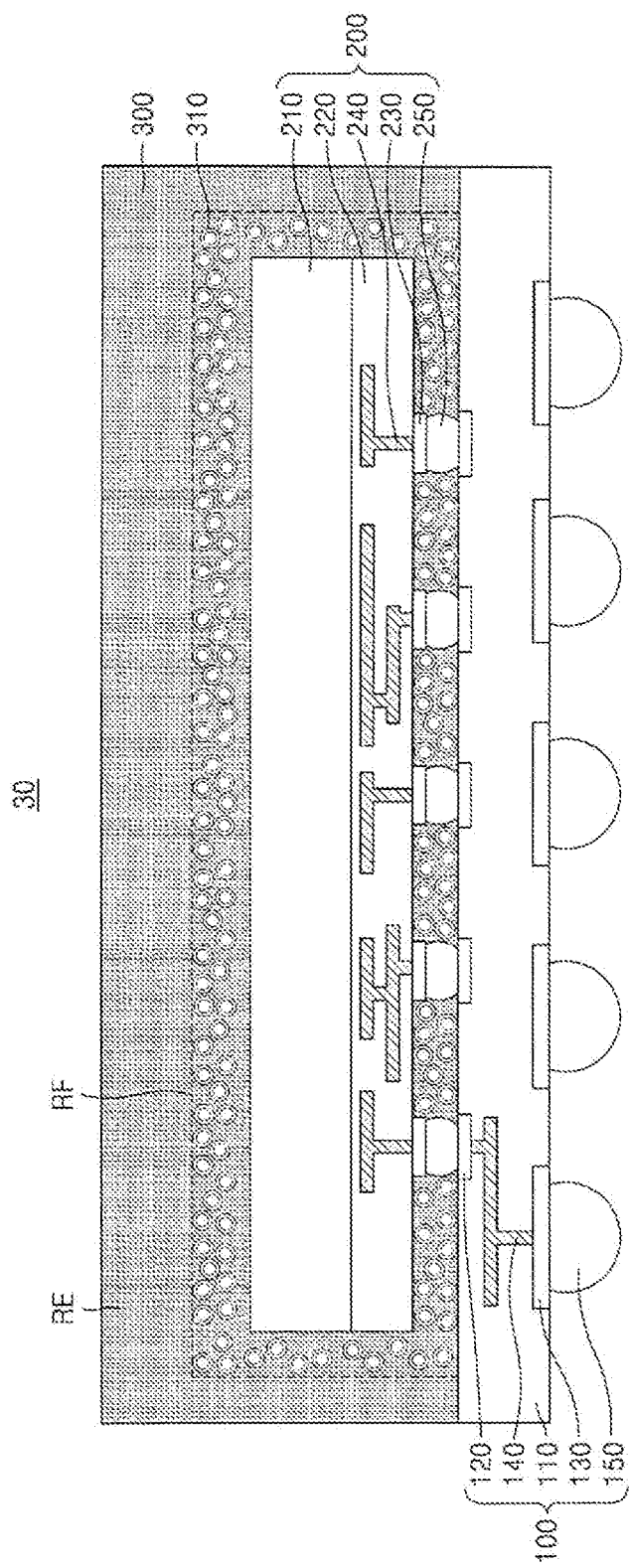
Figure 4:
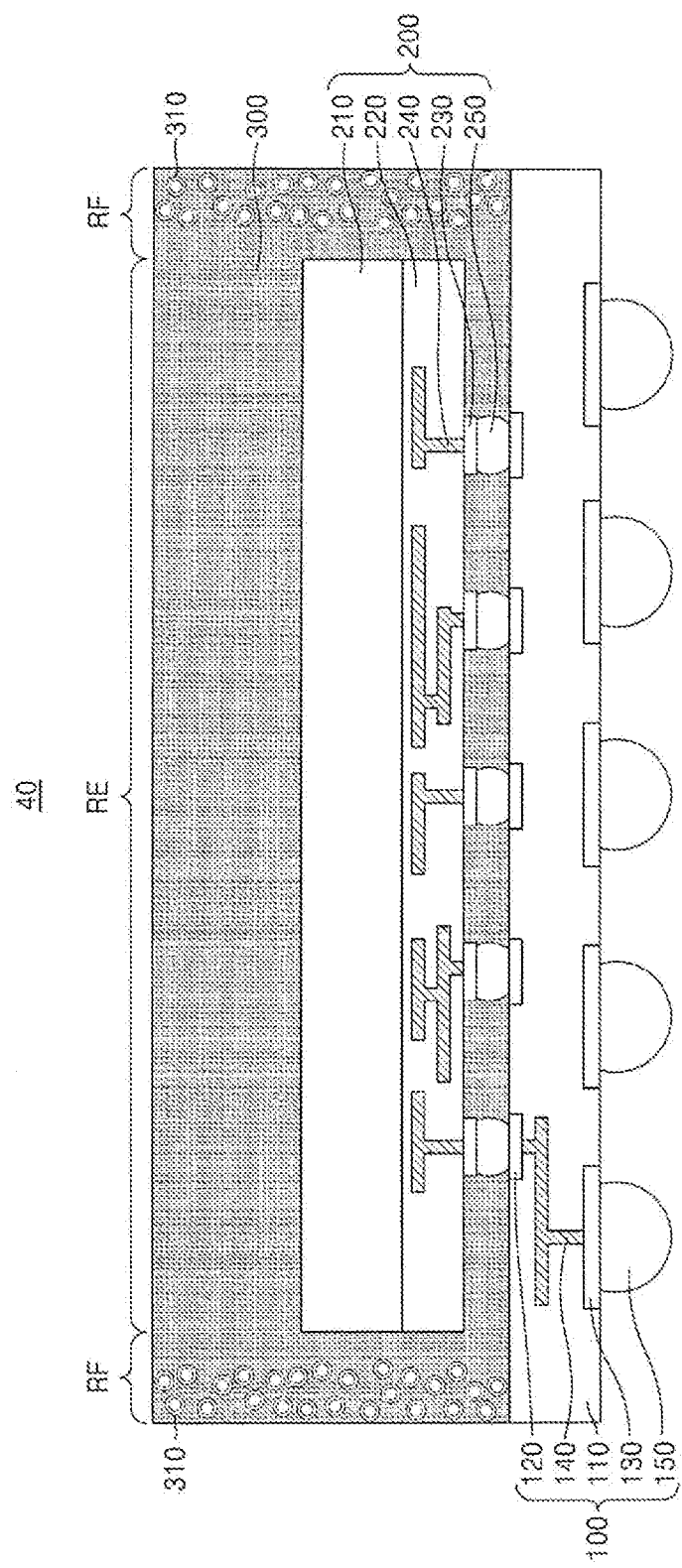

FIGS. 2 through 4 are cross-sectional views respectively showing semiconductor packages 20, 30, and 40 according to other embodiments.

Components included in the semiconductor packages 20, 30, and 40 to be described below and materials included in the components or materials substantially equal or similar to the components or materials described above with reference to FIG. 1. Therefore, for convenience of explanation, differences between the semiconductor package 10 (see FIG. 1) and the semiconductor packages 20, 30, and 40 will be mainly described.

Referring to FIG. 2, in the semiconductor package 20 according to inventive concepts, the filler dense layer RF, which is a region in the molding member 300 where the fillers 310 are placed in a relatively high distribution, may be apart from the semiconductor chip 200 and placed at the upper region of the molding member 300.

The fillers 310 may be moved in a certain direction in the molding member 300 by a force in a first direction (for example, a pulling force) of an electric field or a magnetic field. The fillers 310 may be controlled to be placed in a relatively high distribution in a localized region in the molding member 300 than in other regions in the molding member 300. As it is shown in FIG. 2, the filler dense layer RF may be formed such that the fillers 310 are placed at an outermost region of the molding member 300, and the epoxy dense layer RE may be formed such that the fillers 310 are placed in a relatively lower distribution at a peripheral region of the semiconductor chip 200 and a region between the semiconductor chip 200 and the package substrate 100.

Positions of the filler dense layer RF and the epoxy dense layer RE may be fixed by curing the molding member 300. When the electric field or the magnetic field is removed, the positions of the filler dense layer RF and the epoxy dense layer RE may be maintained.

Referring to FIG. 3, in the semiconductor package 30 according to inventive concepts, the filler dense layer RF, which is a region in the molding member 300 where the fillers 310 are placed in a relatively high distribution, may be placed at the peripheral region of the semiconductor chip 200.

The fillers 310 may be moved in a certain direction in the molding member 300 by the force in the first direction of the electric field or the magnetic field. The fillers 310 may be controlled to be placed in a relatively high distribution in a localized region in the molding member 300 than in other regions in the molding member 300. As shown, the filler dense layer RF may be formed such that the fillers 310 surround the peripheral region of the semiconductor chip 200, and the epoxy dense layer RE may be formed such that the fillers 310 are placed in a relatively low distribution at an outer region of the semiconductor chip 200 except for the peripheral region of the semiconductor chip 200.

The positions of the filler dense layer RF and the epoxy dense layer RE may be fixed by curing the molding member 300. When the electric field or the magnetic field is removed, the positions of the filler dense layer RF and the epoxy dense layer RE may be maintained.

Referring to FIG. 4, in the semiconductor package 40 according to inventive concepts, the filler dense layer RF, which is a region in the molding member 300 where the fillers 310 are placed in a relatively high distribution, may be placed at the side wall regions of the molding member 300.

The fillers 310 may be moved in a certain direction in the molding member 300 by the force in the first direction of the electric field or the magnetic field. The fillers 310 may be controlled to be placed in a relatively high distribution in a localized region in the molding member 300 than in other regions of the molding member 300. As shown, the filler dense layer RF is formed such that the fillers 310 are placed at outermost regions of side walls of the molding member 300, and the epoxy dense layer RE may be formed such that the fillers 310 are placed in a relatively low distribution in the peripheral region of the semiconductor chip 200, the upper region of the molding member 300, and the region between the semiconductor chip 200 and the package substrate 100.

The positions of the filler dense layer RF and the epoxy dense layer RE may be fixed by curing the molding member 300. When the electric field or the magnetic field is removed, the positions of the filler dense layer RF and the epoxy dense layer RE may be maintained.

In other words, the semiconductor packages 20, 30, and 40 according to inventive concepts, which are shown in FIGS. 2 through 4, may be configured to include the filler dense layers RF and the epoxy dense layers RF in positions that are different from the positions of the filler dense layer RF and the epoxy dense layer RF in the semiconductor package 10 (see FIG. 1). As the fillers 310 may be moved in a certain direction in the molding member 300 due to the force in the first direction of the electric field or the magnetic field, the positions of the fillers 310 may be changed into target directions according to designs of the semiconductor packages.

Figure 5:
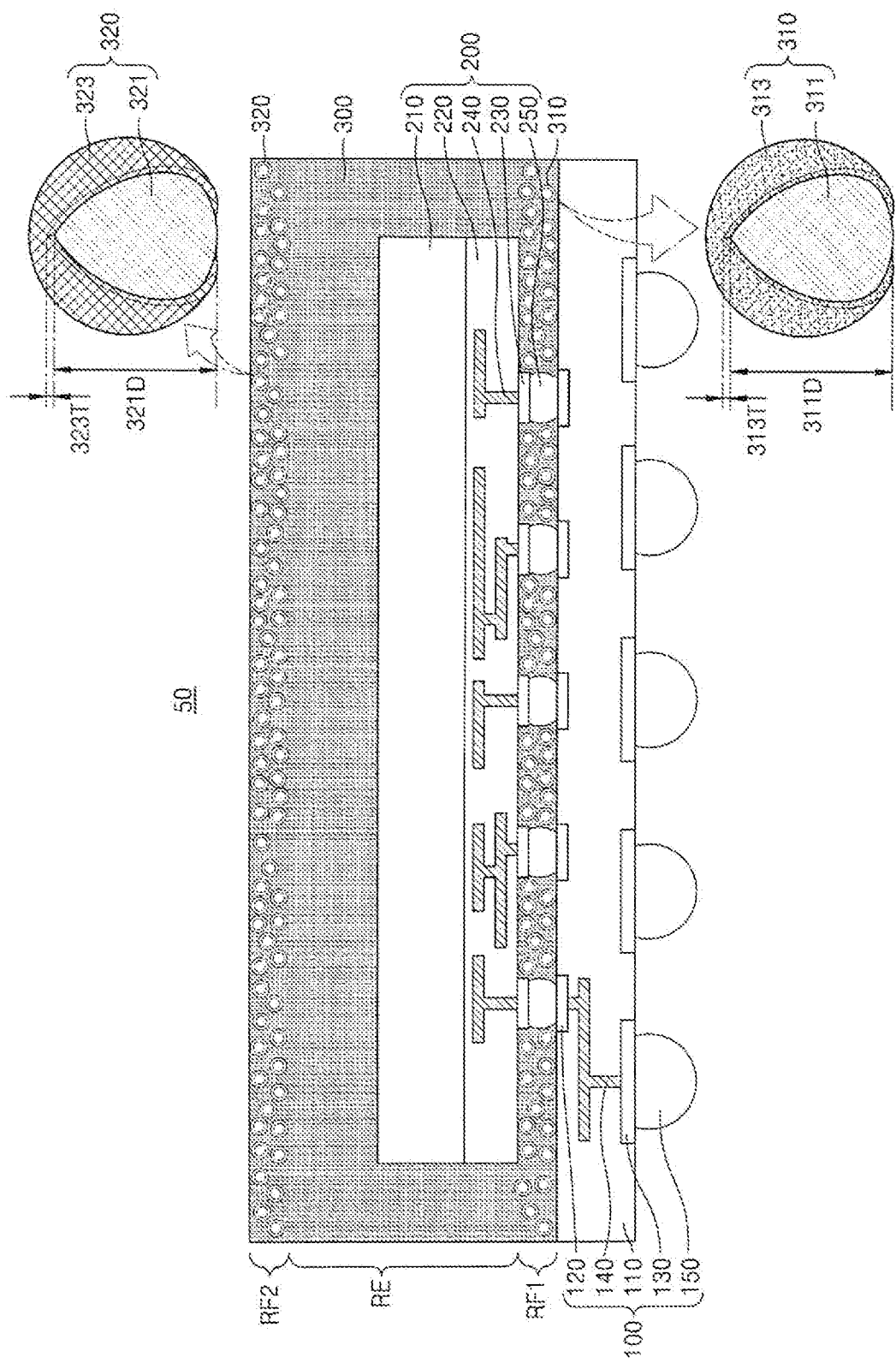
FIGS. 5 and 6 respectively are cross-sectional views of semiconductor packages according to other embodiments.
Figure 6:
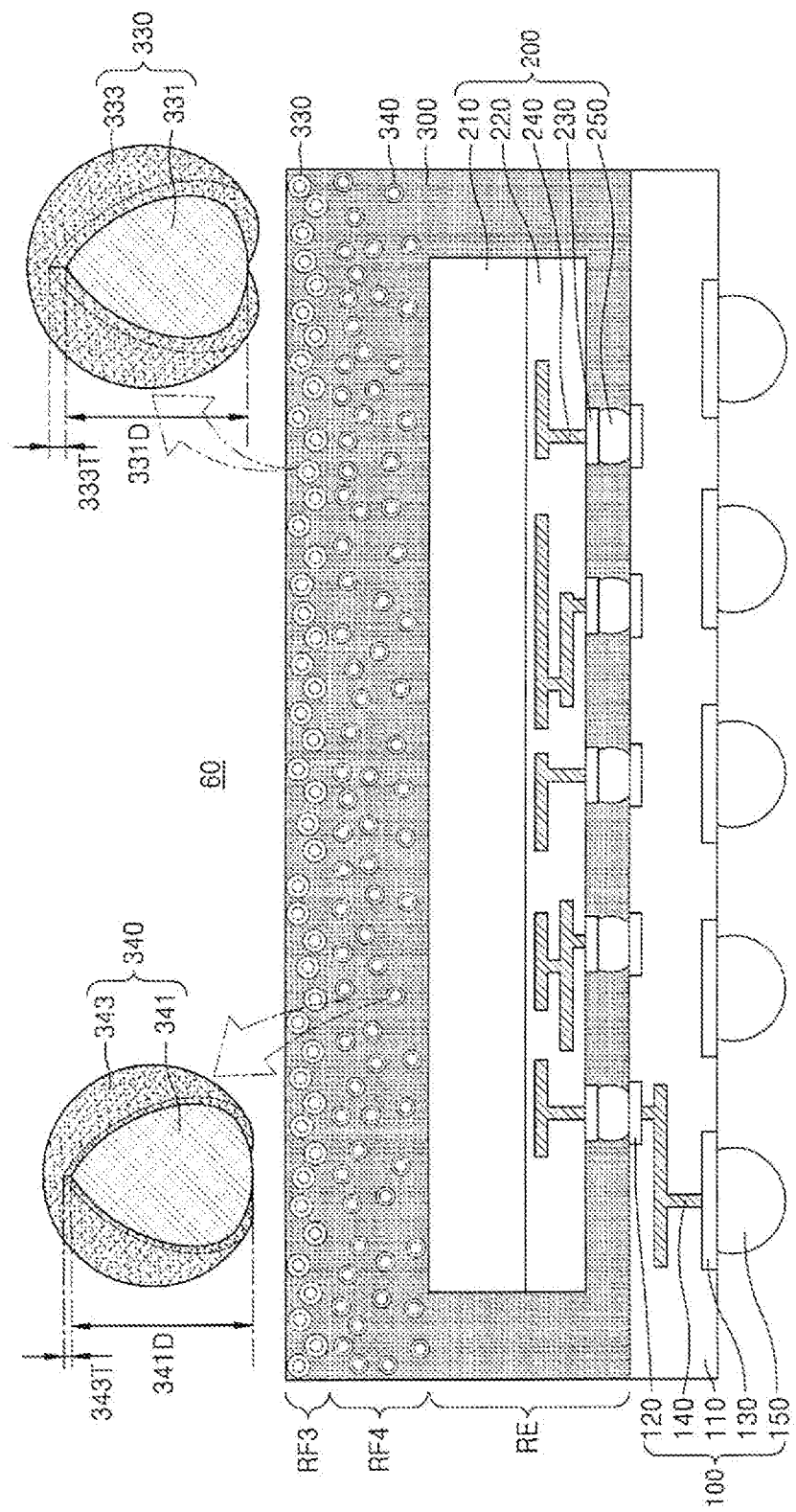

FIGS. 5 and 6 are cross-sectional views respectively showing semiconductor packages 50 and 60 according to other embodiments of inventive concepts.

Components included in the semiconductor packages 50 and 60 to be described below and materials in the components are substantially equal or similar to the components or materials described above with reference to FIG. 1. Therefore, for convenience of explanation, differences between the semiconductor package 10 (see FIG. 1) and the semiconductor packages 50 and 60 will be mainly described.

Referring to FIG. 5, the semiconductor package 50 according to inventive concepts may have a first filler dense layer RF1, which is a region in the molding member 300 where the first fillers 310 are placed in a relatively high distribution, and a second filler dense layer RF2, which is a region in the molding member 300 where the second fillers 320 are placed in a relatively high distribution.

The first fillers 310 and the second fillers 320, which are included in the molding member 300 included in the semiconductor package 50, may respectively have a force in the first direction to the magnetic field and a force in a second direction (for example, a bouncing) that is opposite to the force in the first direction. Accordingly, the first fillers 310 and the second fillers 320 may be placed in different regions in the molding member 300.

Meanwhile, materials included in the core 311 of the first fillers 310 may substantially be identical to materials included in the core 321 of the second fillers 320. In addition, a diameter 311D of the core 311 in the first fillers 310 may be substantially identical to a diameter 321D of the core 321 in the second fillers 320.

Differences between the first fillers 310 and the second fillers 320 may originate from coating layers. The material included in the coating layer 313 of the first fillers 310 may be different from the material included in the coating layer 323 of the second fillers 320. However, in this case, a thickness 313T of the coating layer 313 of the first fillers 310 may substantially be identical to a thickness 323T of the coating layer 323 of the second fillers 320.

More particularly, the material included in the coating layer 313 in the first fillers 310 may be a ferromagnetic material, and the material included in the coating layer 323 of the second fillers 320 may be a diamagnetic material. On the contrary, the material included in the coating layer 313 of the first fillers 310 may be a diamagnetic material, and the material included in the coating layer 323 of the second fillers 320 may be a ferromagnetic material.

A ferromagnetic material, for example, iron (Fe), cobalt (Co), and nickel (Ni), is a material which has a force in a first direction by being magnetized in a same direction as a direction of the magnetic field and maintains magnetism when the magnetic field is removed. On the other hand, a diamagnetic material, for example, copper (Cu), and gold (Au), is a material which has a force in a second direction by being magnetized in a direction that is opposite to the direction of the magnetic field and returns to an original state when the magnetic field is removed.

Therefore, by using the molding member 300 that includes the first fillers 310 and the second fillers 320 respectively having different characteristics, the first filler dense layer RF1, in which the first fillers 310 are placed in a relatively high distribution, and the second filler dense layer RF2, in which the second fillers 320 are placed in a relatively high distribution, may be placed in different regions in the molding member 300. The epoxy dense layer RE may be placed between the first filler dense layer RF1 and the second filler dense layer RF2.

In some embodiments, as shown, the first filler dense layer RF1 may be placed in a region between the semiconductor chip 200 and the package substrate 100 and the second filler dense layer RF2 may be apart from the semiconductor chip 200 and placed in the upper region of the molding member 300. In other embodiments, although it is not shown, the first filler dense layer RF1 may be placed at a region of a left side wall of the molding member 300 and the second filler dense layer RF2 may be placed at a region of a right side wall of the molding member 300. However, the placement of the first filler dense layer RF1 and the second filler dense layer RF2 is not limited thereto.

Referring to FIG. 6, the semiconductor package 60 according to inventive concepts may, in the molding member 300, have a third filler dense layer RF3, in which third fillers 330 are placed in a relatively high distribution, and a fourth filler dense layer RF4, in which fourth fillers 340 are placed in a relatively high distribution.

The third fillers 330 and the fourth fillers 340 included in the molding member 300 included in the semiconductor package 60 may strongly react to the electric field weakly react to the electric field, respectively. In other words, the force in the first direction of the third fillers 330 with respect to the electric field may be greater than the force in the first direction of the fourth fillers 340 with respect to the electric field. Therefore, the third fillers 330 and the fourth fillers 340 may be placed in different regions in the molding member 300.

Meanwhile, a core 331 of the third fillers 330 may include a material that is identical to a material included in a core 341 of the fourth fillers 340. In addition, a diameter 331D of the core 331 of the third fillers 330 may be substantially identical to a diameter 341D of the core 341 of the fourth fillers 340.

Differences between the third fillers 330 and the fourth fillers 340 may originate from coating layers. A thickness 333T of a coating layer 333 of the third fillers 330 may be different from a thickness 343T of a coating layer 343 of the fourth fillers 340. However, in this case, the material included in the coating layer 333 of the third fillers 330 may be identical to the material included in the coating layer 343 of the fourth fillers 340.

More particularly, all the materials included in the coating layer 333 of the third fillers 330 and the coating layer 343 of the fourth fillers 340 may be polyelectrolytes, and the third fillers 330 and the fourth fillers 340 may be manufactured by forming the thickness 333T of the coating layer 333 of the third fillers 330 and a thickness 343T of the coating layer 343 of the fourth fillers 340 to be different from each other.

Polyelectrolytes, for example, polystyrene, polyacrylate, polyallylamine hydrochloride, polylysine, are polymers having an electrolyte group in each repeat unit and being charged when dissolved in the water. Accordingly, polyelectrolytes exist in a positive charge state or a negative charge state and react to an electric field.

Therefore, by using the molding member 300 including the third fillers 330 and the fourth fillers 340, which differently react to the electric field, the third filler dense layer RF3, in which the third fillers 330 are placed in a relatively high distribution, and the fourth filler dense layer RF4, in which the fourth fillers 340 are placed in a relatively high distribution, may be placed in different regions in the molding member 300.

In some embodiments, as shown, the third filler dense layer RF3 may be spaced apart from the semiconductor chip 200 and placed at an uppermost region in the upper region of the molding member 300, and the fourth filler dense layer RF4 may be placed under the third filler dense layer RF3 in the upper region of the molding member 300. An epoxy dense layer RE may be placed under the fourth filler dense layer RF4.

In other embodiments, although it is not shown, the third filler dense layer RF3 may be placed at a lowermost end of a lower region of the molding member 300 and the fourth filler dense layer RF4 may be placed on the third filler dense layer RF in the lower region of the molding member 300. However, the placement of the third filler dense layer RF3 and the fourth filler dense layer Rf4 is not limited thereto.

In other words, the semiconductor packages 50 and 60 according to inventive concepts, which are shown in FIGS. 5 and 6, may be configured to include the filler dense layers RF and the epoxy dense layers RE in positions that are different from the positions of the filler dense layer RF and the epoxy dense layer RE in the semiconductor package 10 (see FIG. 1).

In some embodiments, the first fillers 310 and the second fillers 320 may be formed to have coating layers respectively including different materials and, due to the magnetic field, may be moved in a certain direction in the molding member 300. Therefore, according to the design of the semiconductor package, the positions of the first fillers 310 and the second fillers 320 may be controlled in target directions.

In some embodiments, the third fillers 330 and the fourth fillers 340 may be formed to have coating layers respectively having different thicknesses and, due to the electric field, may be moved into a certain direction in the molding member 300. Therefore, according to the design of the semiconductor package, the positions of the third fillers 330 and the fourth fillers 340 may be controlled in target directions.

Figure 7A:
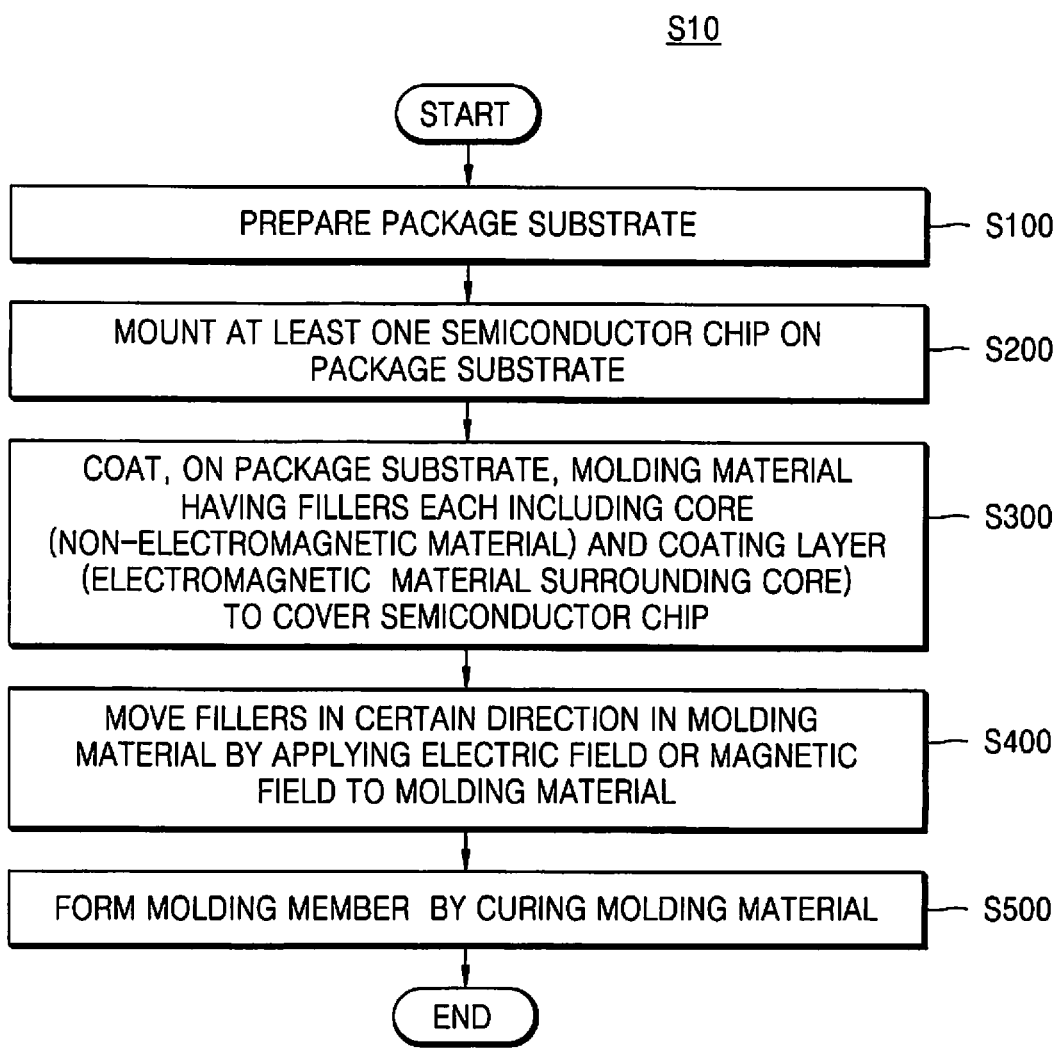
FIG. 7A is a flowchart for describing a method of manufacturing a semiconductor package, according to an embodiment of inventive concepts.
Figure 7B:
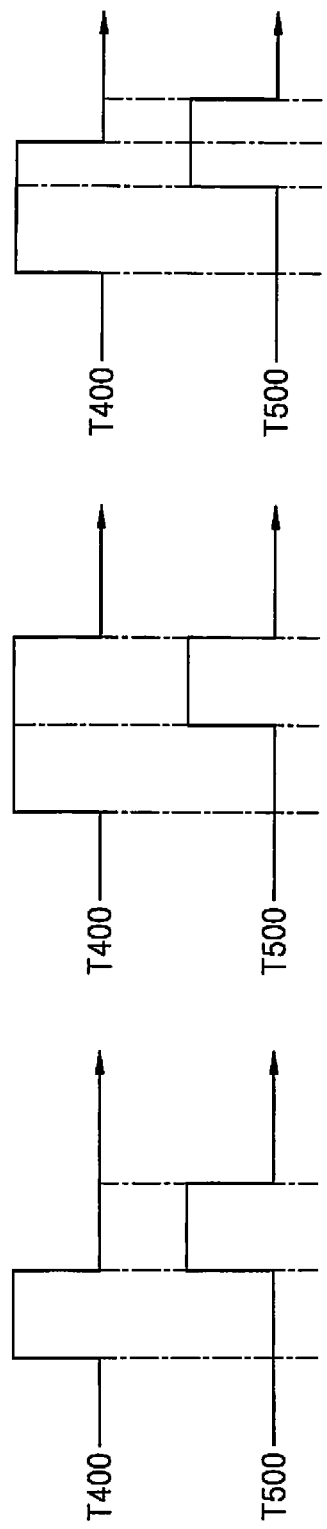
FIG. 7B is a group of graphs showing process time in the method of manufacturing the semiconductor package according to an embodiment.

FIG. 7A is a flowchart of a method of manufacturing a semiconductor package, according to an embodiment of inventive concepts, and FIG. 7B is a group of graphs showing a process time in the method of manufacturing the semiconductor package according to an embodiment of inventive concepts.

Referring to FIG. 7A, the method of manufacturing a semiconductor package (S10) may include processes that are described below. When an embodiment is differently implemented, a certain process may be performed differently from the process that is described. For example, two processes that are described in succession may substantially be performed simultaneously, or the processes may be performed in an order that is opposite to an order of description.

The method of manufacturing the semiconductor package (S10) according to inventive concepts includes preparing a package substrate (S100), mounting at least one semiconductor chip on the package substrate (S200), coating, on the package substrate, a molding material having fillers each including a core including a non-electromagnetic material, and a coating layer including an electromagnetic material that covers the core, to surround the at least one semiconductor chip (S300), moving the fillers in certain directions within the molding material by applying an electric field or a magnetic field to the molding material (S400), and forming a molding member by curing the molding material (S500).

Technical features of each of the process will be described in detail with reference to FIGS. 8A through 9D which will be described later.

In the method of manufacturing the semiconductor package S10 (see FIG. 7A) according to inventive concepts, FIG. 7B shows a relationship between a processing time of applying an electric field or a magnetic field to a molding material T400 and a processing time of hardening a molding material T500.

In some embodiments, after the process of applying the electric field or the magnetic field to the molding material, the process of curing the molding material may begin. In other words, a processing time of applying the electric field or the magnetic field to the molding material T400 and a processing time of curing the molding material T500 may be separated from each other.

In other embodiments, the process of applying the electric field or the magnetic field to the molding material may begin before the process of curing the molding material begins, and the process of applying the electric field or the magnetic field to the molding material and the process of curing the molding material may be finished at the same time. Alternatively, the process of applying the electric field or the magnetic field to the molding material may begin before the process of curing the molding material begins, and the process of curing the molding material may be finished after the process of applying the electric field or the magnetic field to the molding material is finished. In other words, the processing time of applying the electric field or the magnetic field to the molding material T400 and the processing time of curing the molding material T500 may at least partially overlap each other. However, the processing times T400 and T500 are not limited thereto.

FIGS. 8A through 8D are cross-sectional views showing a method of manufacturing a semiconductor package, according to an embodiment.

Figure 8A:
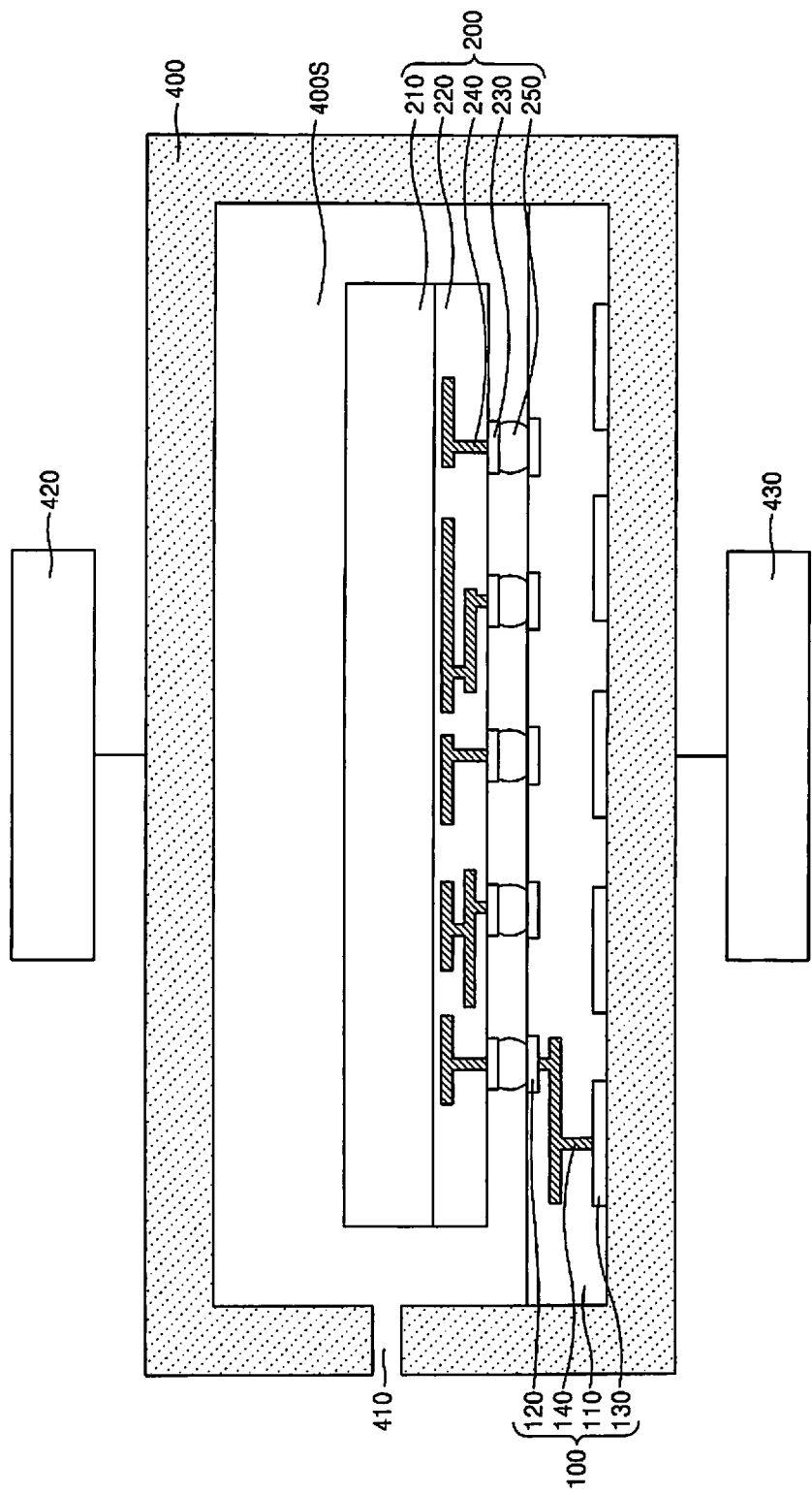
FIGS. 8A through 8D are cross-sectional views showing a method of manufacturing a semiconductor package, according to an embodiment.

Referring to FIG. 8A, a housing 400 that defines an internal region 400S in which the molding member 300 (see FIG. 8D) is to be formed is prepared, and the package substrate 100, on which the semiconductor chip 200 is mounted, is placed in the internal region 400S. The housing 400 may include the electric field unit 420 (e.g., RF generator) that generates an electric field and/or the magnetic field unit 430 (e.g., magnetron) that generates a magnetic field.

The molding member 300 (see FIG. 8D) of the semiconductor package, which is formed by a transfer molding process, may be implemented according to the form that is defined by the housing 400. Accordingly, the housing 400 may be previously determined according to the molding member 300 (see FIG. 8D) that is to be formed.

Meanwhile, the housing 400 may include an injection path 410, into which the molding material 300M (see FIG. 8B), and an ejection path (not shown), through which the molding material 300M (see FIG. 8B) filling the internal region 400S of the housing 400 may be ejected.

Figure 8B:
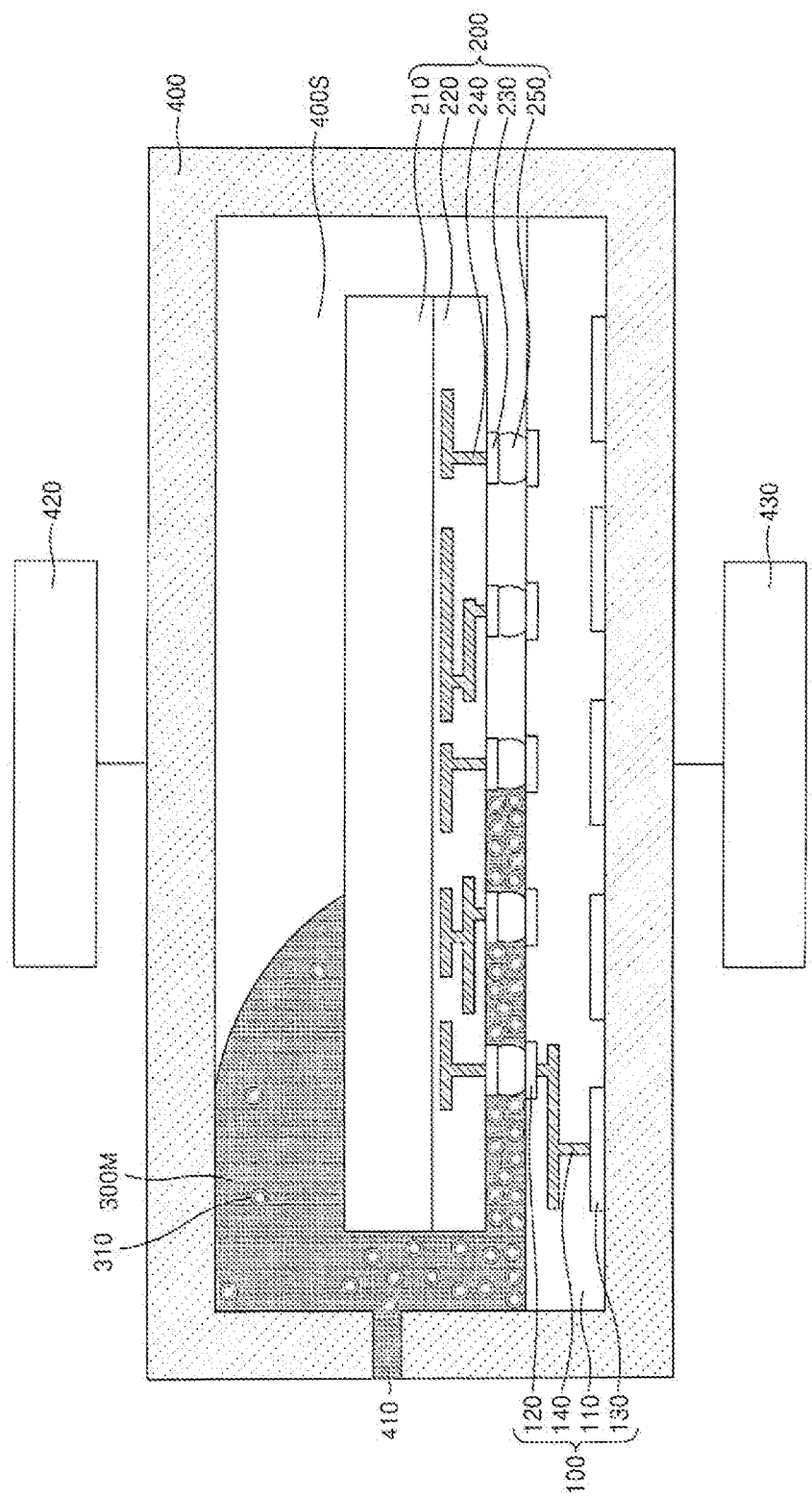

Referring to FIG. 8B, the molding material 300M may be injected into the internal region 400S of the housing 400. The molding material 300M may include a large amount of the fillers 310 that are spherical and randomly scattered in epoxy molding compound. For example, the molding material 300M may be formed from an epoxy based material including at least from about 50 wt % to about 90 wt % of the filler 310.

The molding material 300M is, in a fluid state, injected into the internal region 400S of the housing 400 and may be injected until the internal region 400S is completely filled. The process of injecting the molding material 300M within the housing 400 may be performed in a vacuum condition.

By the injection process, an appropriate amount of the molding material 300M is injected onto the package substrate 100. As it is needed, via a pressurization process such as a press, a pressure may be applied to the molding material 300M. In this case, process conditions such as a delay time between the injection of the molding material 300M and pressurization, an amount of molding material 300M that is injected, a pressurization temperature/pressure may be set considering a physical characteristic, for example, viscosity of the molding material 300M.

The molding material 300M is injected to fill the internal region 400S without an empty region. Implementing high capacity memory in a limited structure of a semiconductor package requires a small thickness of semiconductor chip stack, and therefore, thicknesses of semiconductor packages are steadily decreasing. In the semiconductor package, a size of the internal connection terminal 250 also continually decreases, and a process of filling the region between the semiconductor chip 200 and the package substrate 100 may be very difficult to perform.

In the method of manufacturing the semiconductor package according to inventive concepts, when the molding material 300M is injected, the electric field unit 420 to generate the electric field or the magnetic field unit 430 to generate the magnetic field may be operated, and the fillers 310 may, by the electric field or the magnetic field, be placed to fill between the semiconductor chip 200 and the package substrate 100.

According to the movement of the fillers 310, the molding material 300M may move in a similar direction to the direction in which the fillers 310 move. In other words, by the electric field or the magnetic field, the fillers 310 are moved to be placed around the internal connection terminals 250. Accordingly, the molding material 300M, which may simultaneously be influenced by movements of the fillers 310 and an injection pressure, may be easily injected to surround the internal connection terminals 250 without an empty region.

Figure 8C:
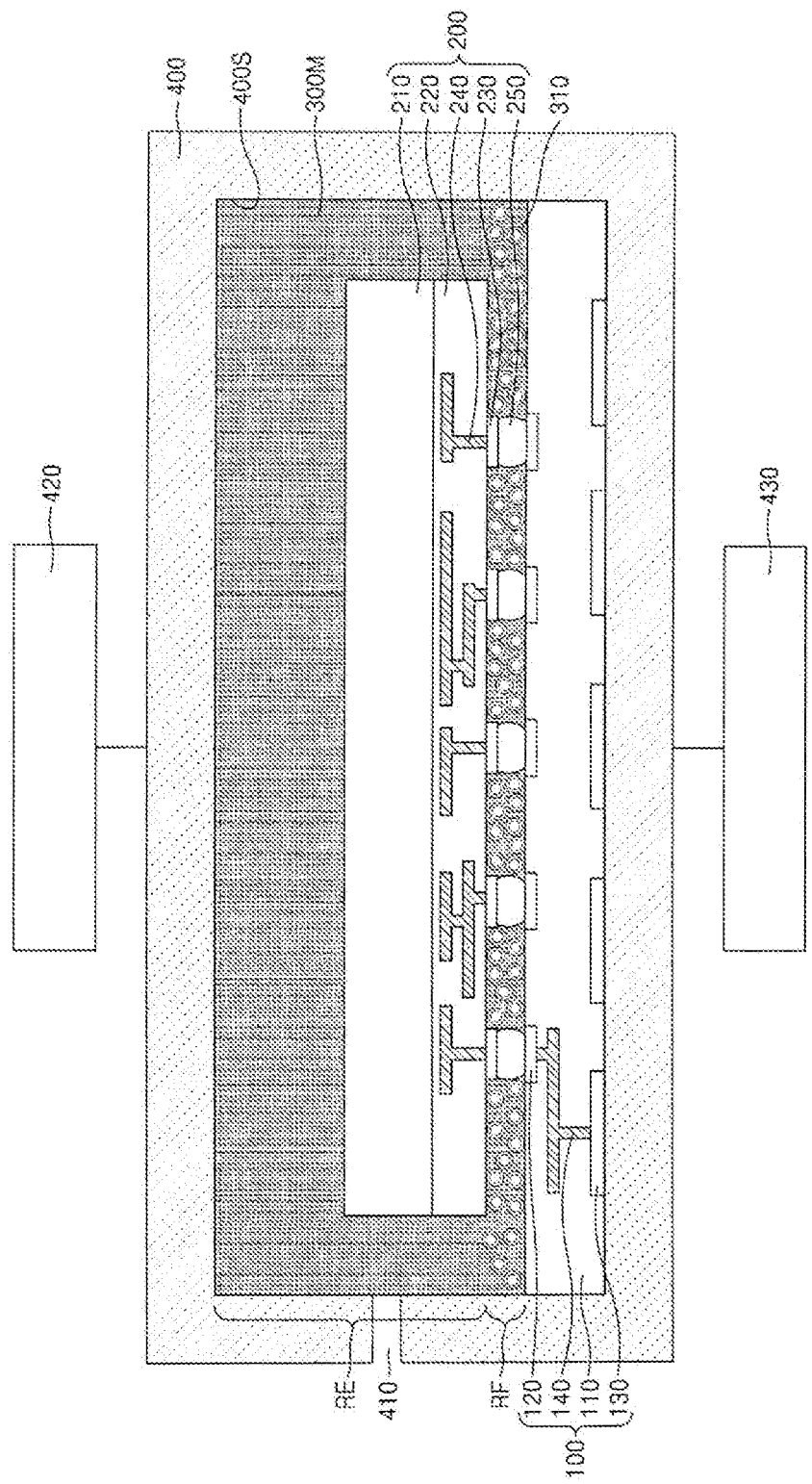

Referring to FIG. 8C, after the internal region 400S of the housing 400 is filled (e.g., completely filled) with the molding material 300M, the molding material 300M may be cured.

In the method of manufacturing the semiconductor package according to inventive concepts, after the molding material 300M is injected, the electric field unit 420 to generate the electric field or the magnetic field unit 430 to generate the magnetic field may be operated, and the fillers 310 may, by the electric field or the magnetic field, be placed to fill between the semiconductor chip 200 and the package substrate 100.

In this case, the filler 310 may be moved in a certain direction in the molding material 300M by the force in the first direction between the electric field generated by the electric field unit 420 or between the magnetic field generated by the magnetic field unit 430. Accordingly, as shown, the filler dense layer RF may be formed in the lower region of the molding material 300M, and the epoxy dense layer RE may be formed in the upper region of the molding material 300M.

Positions of the filler dense layer RF and the epoxy dense layer RE may be fixed by curing the molding material 300M. The curing may be thermosetting or photo-curing. The molding material 300M that is cured loses fluidity, and the positions of the filler dense layer RF and the epoxy dense layer RE may be maintained when the electric field or the magnetic field is removed.

By using the method of manufacturing the semiconductor package according to inventive concepts, the filler dense layer RF and the epoxy dense layer RE may respectively be formed in different regions within the molding material 300M. As the fillers 310 may be moved in a certain direction in the molding member 300 due to the force in the first direction of the electric field or the magnetic field, the positions of the fillers 310 may be changed into target directions according to the design of the semiconductor package.

Unlike it is shown, the filler dense layer RF, which is the region in the molding material 300M where the fillers 310 are placed in a relatively high distribution, may be spaced apart from the semiconductor chip 200 and placed in the upper region of the molding material 300M, at the side wall regions of the molding material 300M, or in the peripheral region of the semiconductor chip 200.

Figure 8D:
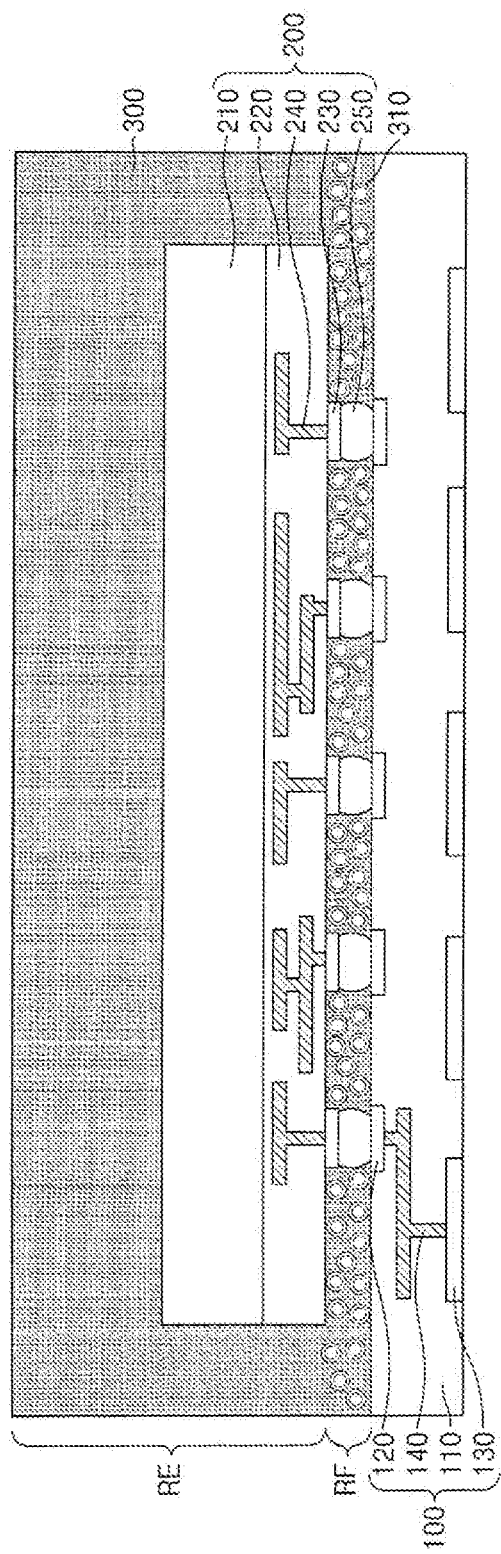

Referring to FIG. 8D, a preparatory semiconductor package, in which the molding member 300 surrounding the semiconductor chip 200 is formed, may be manufactured on the package substrate 100. The side and the top surface of the molding member 300 may have the form of a right angle which has an angle of about 90 degrees.

The preparatory semiconductor package, in which the molding member 300 is formed, may be separated from the housing 400 (see FIG. 8C). Although it is not shown, a process of forming, at a region of the side of the molding member, a marking pattern including data of the semiconductor chip 200, for example, a bar code, a number, a character, a symbol, and the like, may be performed.

Figure 9A:
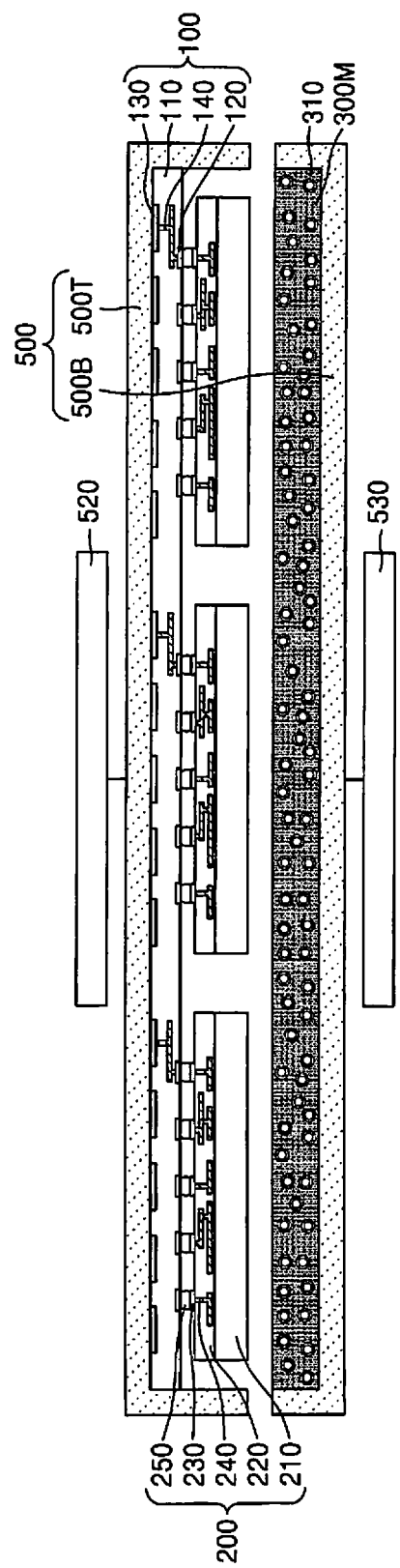
FIGS. 9A through 9D are cross-sectional views showing a method of manufacturing a semiconductor package, according to another embodiment.

FIGS. 9A through 9D are cross-sectional views showing a method of manufacturing a semiconductor package, according to another embodiment;

Referring to FIG. 9A, a housing 500, in which the molding member 300 (see FIG. 9D) will be formed, may be prepared. The housing 500 may include a bottom housing 500B and a top housing 500T. The bottom housing 500B is filled with the molding material 300M, and the package substrate 100, on which the plurality of semiconductor chips 200 are mounted, is placed in the top housing 500T. The housing unit 500 may include an electric field unit 520 (e.g., RF generator) that generates an electric field and/or a magnetic field unit 530 (e.g., magnetron) that generates a magnetic field.

The molding member 300 (see FIG. 9D) of the semiconductor package, which is formed by a compression molding process, may be implemented according to the form that is defined by the housing 500. Accordingly, the housing 500 may be previously determined according to the molding member 300 (see FIG. 9D) that is to be formed.

Meanwhile, the housing 500 may include the bottom housing 500B that includes the molding material 300M, and the top housing 500T that includes, above the bottom housing 500B, the package substrate 100 on which the plurality of semiconductor chips 200 are mounted.

Figure 9B:
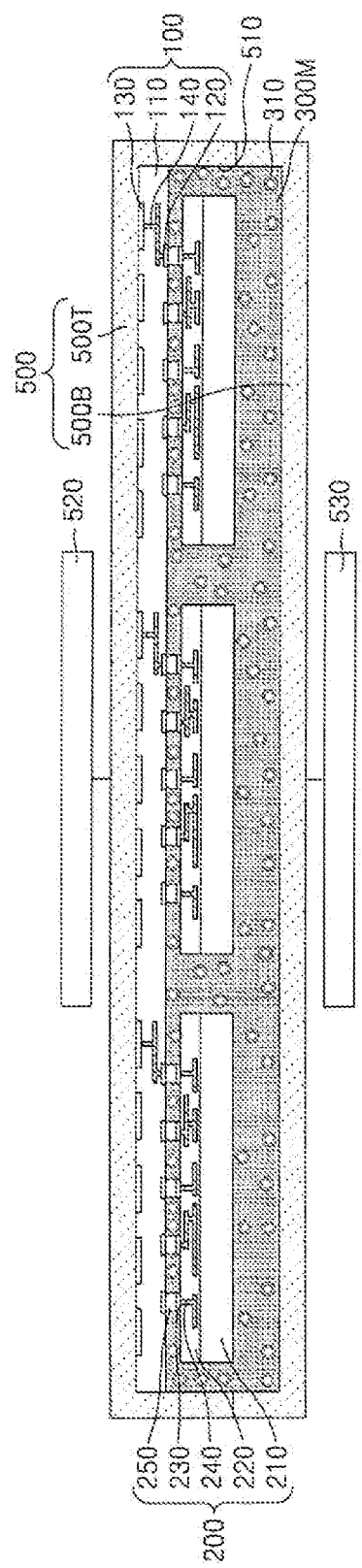

Referring to FIG. 9B, the molding material 300M may be moved into an internal region 510 of the housing 500. The molding material 300M may include a large amount of the fillers 310 that are spherical in epoxy molding compound. For example, the molding material 300M may be formed from an epoxy based material including at least from about 50 wt % to about 90 wt % of the filler 310.

The molding material 300M is, in a fluid state, moved into the internal region 510 of the housing 500 and may be moved until the internal region 510 is completely filled with the molding material 300M. The fillers 310 may be placed in a randomly scattered state in the molding material 300M. In other words, the electric field unit 520 and/or the magnetic field unit 530 may not have generated an electric field or a magnetic field.

Figure 9C:
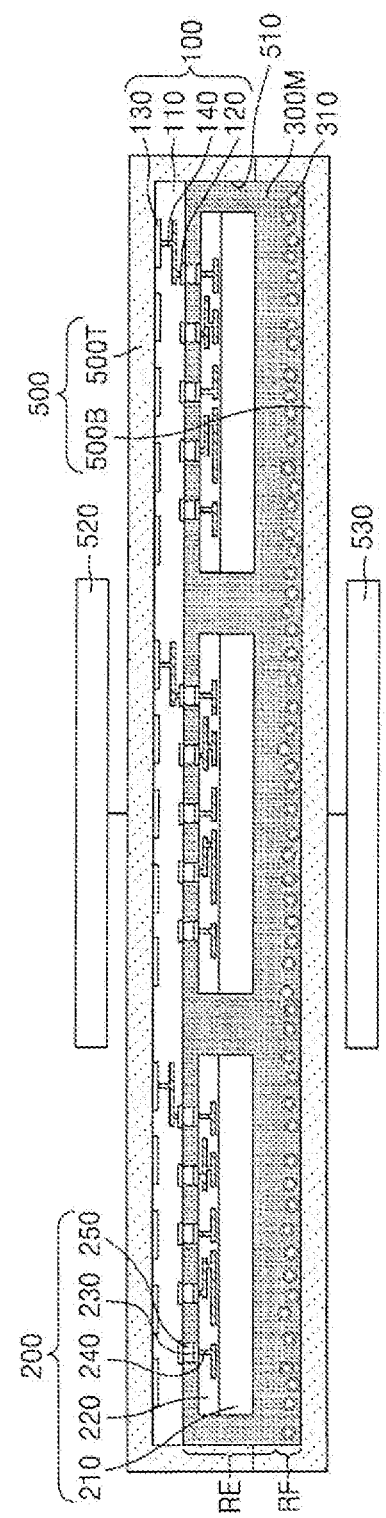

Referring to FIG. 9C, in the method of manufacturing the semiconductor package, when the molding material 300M is moved, by operating the electric field unit 420 to generate the electric field or the magnetic field unit 430 to generate the magnetic field, the fillers 310 may be spaced apart from the plurality of semiconductor chips 200 due to the electric field or the magnetic field and placed in the upper region of the molding material 300M.

In this case, the filler 310 may be moved in a certain direction in the molding material 300M by the force in the first direction between the electric field generated by the electric field unit 420 or between the magnetic field generated by the magnetic field unit 430. Accordingly, as shown, the filler dense layer RF may be formed in the upper region of the molding material 300M, and the epoxy dense layer RE may be formed in the lower region of the molding material 300M.

Positions of the filler dense layer RF and the epoxy dense layer RE may be fixed by curing the molding material 300M. The curing may be thermosetting or photo-curing. The molding material 300M that is cured loses fluidity, and the positions of the filler dense layer RF and the epoxy dense layer RE may be maintained when the electric field or the magnetic field is removed.

Unlike it is shown, the filler dense layer RF, which is the region in the molding material 300M where the fillers 310 are placed in a relatively high distribution, may be placed to fill between the plurality of semiconductor chips 200 and the package substrate 100, the filler dense layer RF may be placed at the side wall regions of the molding material 300M, or alternatively, the filler dense layer RF may be placed in the peripheral region of the plurality of semiconductor chips 200.

Figure 9D:
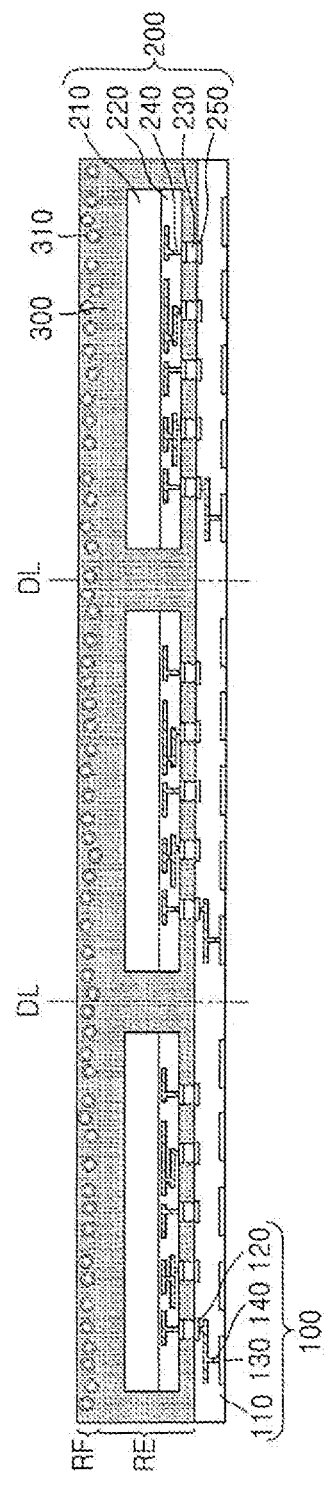

Referring to FIG. 9D, a preparatory semiconductor package, in which the molding member 300 surrounding the plurality of semiconductor chips 200 on the package substrate 100, may be manufactured.

By a series of semiconductor processes, the preparatory semiconductor package may be provided in a form including the package substrate 100, the plurality of semiconductor chip 200, and the molding member 300. By using a mechanical cutter or a razor cutter to perform a cutting process in dicing lines DL, semiconductor packages that are individually divided may be manufactured.

The dicing lines DL are used for dividing the preparatory semiconductor package into individual semiconductor packages. Accordingly, the side of the package substrate 100 and the side of the molding member 300 may substantially be placed on a same plane. In addition, the side and the top surface of the molding member 300 may have the form of a right angle which has an angle of about 90°.

Figure 10A:
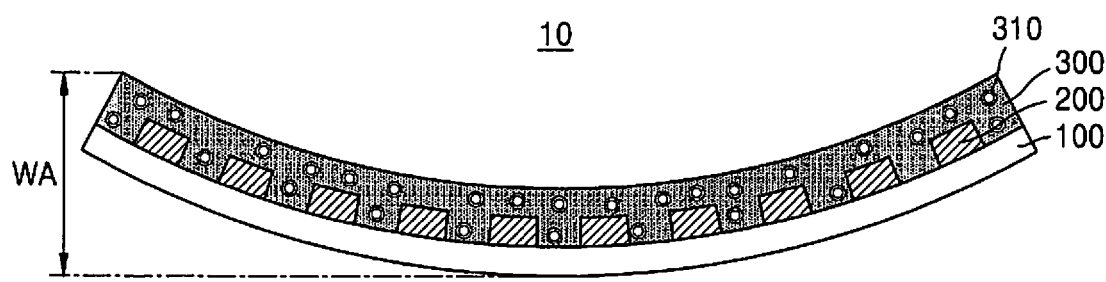
FIGS. 10A through 10C are cross-sectional views showing warpage of a semiconductor package.
Figure 10B:
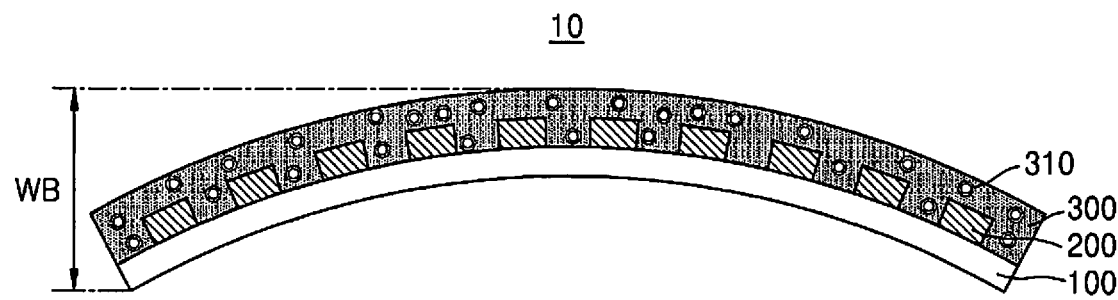
Figure 10C:
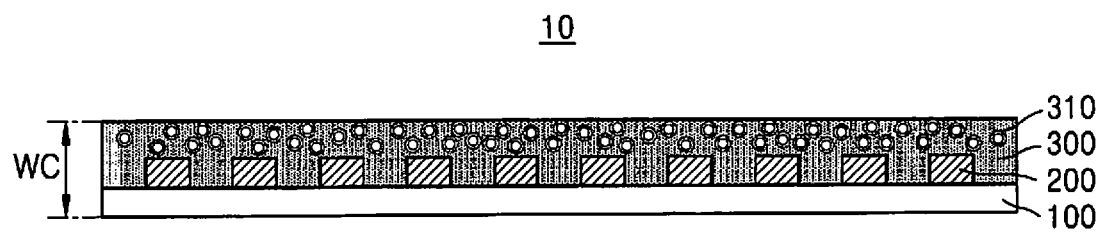

FIGS. 10A through 10C are cross-sectional views showing warpage of a semiconductor package;

Referring together to FIGS. 10A through 10C, in the semiconductor package 10, the plurality of semiconductor chips 200 are mounted on a top surface of the package substrate 100, and the molding member 300 that surrounds the plurality of semiconductor chips 200 is formed. Accordingly, the top surface of the package substrate 100 is substantially and completely covered by the molding member 300.

In the semiconductor package 10 having the above-described structure, materials included in the package substrate 100, the plurality of semiconductor chips 200, and the molding member 300 are different from one another and may have coefficients of thermal expansion that are different from one another. Accordingly, environmental changes in temperature, pressure, and the like during the process of manufacturing the semiconductor package 10 may result in warpage of the semiconductor package 10.

For example, in the case of the package substrate 100, under a room temperature or a high temperature, the molding member 300 may shrink or expand, thereby resulting in deformation such as warpage to the semiconductor package 10. In addition, as shown in FIGS. 10A and 10B, when the fillers 310 included in the molding member 300 are arranged in a state of being randomly mixed-up, impacts to the fillers 310 may be ignored.

When coefficients of thermal expansion of the package substrate 100 and the molding member 300 in the semiconductor package 10 are different from each other, when a compressive stress is applied to the molding member 300 and a tensile stress is applied to the package substrate 100, warpage may occur such that the semiconductor package 10 has a form in which a center region is curved downwards, as shown in FIG. 10A. On the other hand, when a tensile stress is applied to the molding member 300 and a compressive stress is applied to the package substrate 100, warpage may occur such that the semiconductor package 10 has a form in which the center region is curved upwards, as shown in FIG. 10B. In other words, due to warpage of the semiconductor package 10, the semiconductor package 10 may not be flat and there may be height differences WA and WB between the center region and the peripheral regions.

As shown in FIG. 10C, in the semiconductor package 10 according to inventive concepts, the coefficients of thermal expansion may be different in different regions according to distribution of the fillers 310, and therefore, the coefficients of thermal expansion in the upper region and the lower region in the molding member 300 may be different from each other. Accordingly, by controlling the distribution of the fillers 310 in target directions, the warpage of the semiconductor package 10 may be alleviated compared to the warpage of the semiconductor package 10 that is described with reference to FIGS. 10A and 10B. In other words, when the fillers 310 are placed in a high distribution in the localized region of the molding member 300, the warpage of the semiconductor package 10 may be alleviated due to influence of the fillers 310. Although it is not shown, the fillers 310 in the molding member 300 may respectively include at least two kinds of materials having different coefficients of thermal expansion.

As a result, in the semiconductor package 10 according to inventive concepts, the positions of the fillers 310 are controlled by using an electric field or a magnetic field considering the coefficients of thermal expansion of the materials included in the package substrate 100, the plurality of semiconductor chips 200, and the molding member 300, and thus, the tensile stress and the compressive stress applied to the semiconductor package 10 may be effectively controlled and the warpage of the semiconductor package 10 may be reduced and/or minimized.

Figure 11:
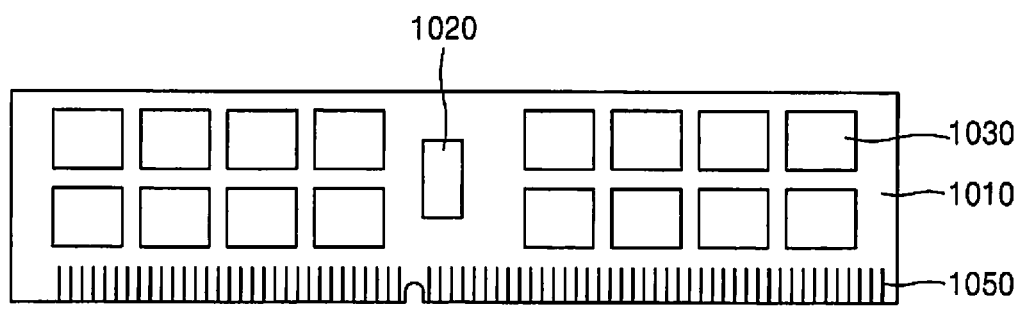
FIG. 11 is a top-plan view showing a semiconductor module including a semiconductor package according to an embodiment.

FIG. 11 is a top-plan view showing a semiconductor module 1000 including a semiconductor package 1030 according to an embodiment.

Referring to FIG. 11, the semiconductor module 1000 includes a module substrate 1010, a control chip 1020 mounted on the module substrate 1010, and a plurality of semiconductor packages 1030 mounted on the module substrate 1010.

A plurality of input/output terminals 1050, which may be coupled to sockets of a main board, are placed at one side of the module substrate 1010. The plurality of semiconductor package 1030 may be the semiconductor packages 10, 20, 30, 40, 50, and 60 according to inventive concepts. The plurality of semiconductor packages 1030 may be manufactured according to the method of manufacturing the semiconductor package (S10) according to inventive concepts.

Figure 12:
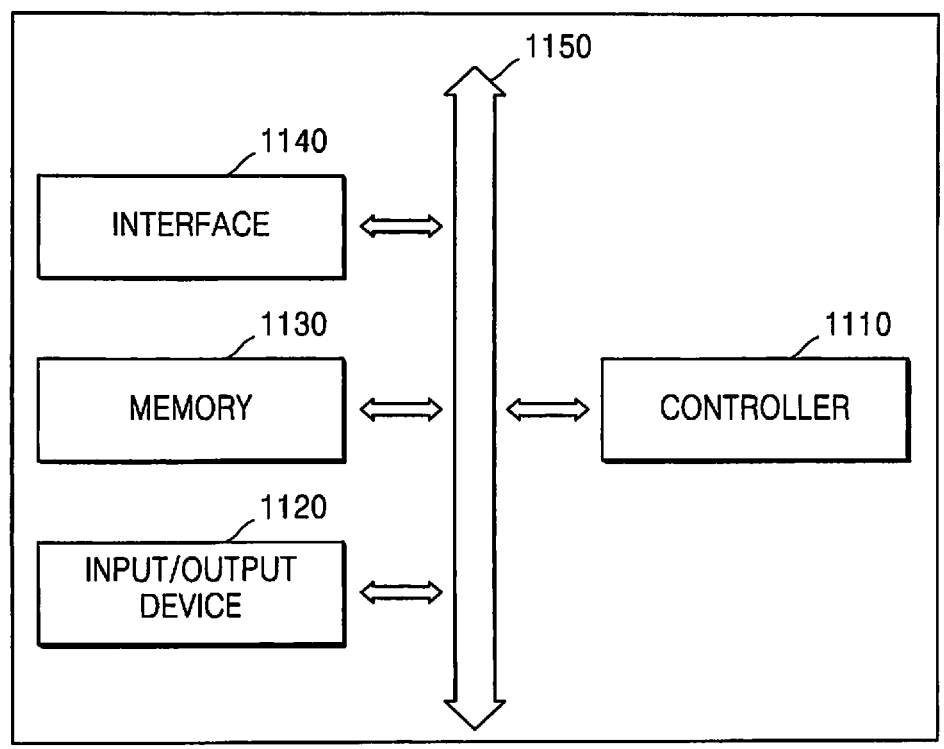
FIG. 12 is a schematic diagram showing a system of a semiconductor package according to an embodiment of inventive concepts.

FIG. 12 is a schematic diagram showing a system 1100 of a semiconductor package that is manufactured in the method of manufacturing the semiconductor package according to the embodiments of inventive concepts.

Referring to FIG. 12, the system 1100 includes a controller 1110, an input/output device 1120, a memory 1130, an interface 1140, and a bus 1150.

The system 1100 may be a system that transmits or receives data or a mobile system. In some embodiments, the mobile system may be a portable computer, a web tablet, a mobile phone, a digital music player, or a memory card.

The controller 1110, which is used for controlling programs executed in the system 1100, may include a microprocessor, a digital signal processor, a microcontroller, or the like.

The input/output device 1120 may be used to input or output data of the system 1100. The system 1100 is connected to an external device such as a personal computer or a network by using the input/output device 1120 and exchange data with the external device. The input/output device 1120 may, for example, be a touchpad, a keyboard, or a display.

The memory 1130 may store data for operation of the controller 1110 or data that is processed in the controller 1110. The memory 1130 may be the semiconductor packages 10, 20, 30, 40, 50, or 60 according to inventive concepts. In addition, the memory 1130 may be manufactured in the method of manufacturing the semiconductor package S10 according to inventive concepts.

The interface 1140 may be a data transmission path between the system 1100 and an external device. The controller 1110, the input/output device 1120, the memory 1130, and the interface 1140 may communicate with one another via the bus 1150.

While inventive concepts has been particularly shown and described with reference to attached drawings, it will be understood by one of ordinary skill in the art that various changes in forms and details may be made therein without departing from the spirit and scope of inventive concepts. Hence, it will be understood that the embodiments described above are not limiting of the scope of inventive concepts.

What is claimed is:

1. A semiconductor package comprising:
   a package substrate;
   at least one semiconductor chip mounted on the package substrate; and
   a molding member that surrounds the at least one semiconductor chip,
   the molding member including fillers,
   each of the fillers including a core and a coating layer that surrounds the core,
   the core including a non-electromagnetic material,
   the coating layer including an electromagnetic material, and
   the molding member including regions that respectively have different distributions of the fillers, at least some of the fillers in the molding member being adjacent to the semiconductor chip, wherein
   the molding member includes a first region and a second region,
   the first region has a first concentration of the fillers,
   the second region has a second concentration of the fillers that is less than the first concentration,
   the second region is over the first region and extends over the at least one semiconductor chip, and
   the at least one semiconductor chip is on the first region.

2. The semiconductor package of claim 1, wherein the fillers in the molding member are placed in a relatively high distribution at a peripheral region of the at least one semiconductor chip.

3. The semiconductor package of claim 1, wherein the fillers in the molding member are configured to be moved in a direction in which warpage of the package substrate is alleviated, and
   the molding member is configured to have different coefficients of thermal expansion in different regions among the regions in the molding member according to the different distributions of the fillers.

4. The semiconductor package of claim 3, wherein the regions of the molding member include an upper region of the molding member and a lower region of the molding member,
   a coefficient of thermal expansion in the upper region of the molding member and a coefficient of thermal expansion in the lower region of the molding member are different from each other.

5. The semiconductor package of claim 1, wherein
the fillers include first fillers and second fillers,
the first fillers are configured to react relatively strongly to an electric field compared to the second fillers,
the second fillers that are configured to react relatively weakly to the electric field compared to the first fillers, and
the first fillers and the second fillers are placed in different regions among the regions in the molding member.

6. The semiconductor package of claim 5,
diameters of the first fillers are different from diameters of the second fillers, and
a material in the coating layer of the first fillers is identical to a material in the coating layer of the second fillers.

7. The semiconductor package of claim 1, wherein
the fillers include first fillers and second fillers,
the first fillers have a force in a first direction in response to a magnetic field,
the second fillers that have a force in a second direction in response to the magnetic field,
the second direction is opposite the first direction, and
the first fillers and the second fillers are placed in different regions among the regions in the molding member.

8. The semiconductor package of claim 7, wherein
a material in the coating layer of the first fillers is different from a material in the coating layer of the second fillers.

9. The semiconductor package of claim 1, wherein fillers are distributed in an epoxy material,
the fillers are configured to be moved in a certain direction within the molding member in response to an electric field or a magnetic field that is applied to the molding member.

10. The semiconductor package of claim 9, wherein
the core includes silicon oxide or aluminum oxide, and
the coating layer includes one of a metal, a metal oxide, a polymer, a polymer electrolyte, and a carbon composite material.

11. The semiconductor package of claim 10, wherein
the fillers include first fillers and second fillers,
the first fillers are configured to react relatively strongly to an electric field compared to the second fillers,
the second fillers are configured to react relatively weakly to the electric field compared to the first fillers,
the electromagnetic material in the coating layer of the first fillers and the electromagnetic material in the coating layer of the second fillers include a polymer electrolyte, and
a thickness of the coating layers of the first fillers is different from a thickness of the coating layers of the second fillers.

12. The semiconductor package of claim 10, wherein
the fillers include first fillers and second fillers,
the first fillers are configured to have a force in a first direction in response to the magnetic field,
the second fillers are configured to have a force in a second direction in response to the magnetic field,
the second direction is opposite the first direction,
the electromagnetic material in the coating layer of the first fillers is a ferromagnetic material,
the electromagnetic material in the coating layer of the second fillers is a diamagnetic material, and
the coating layer of the first fillers and the coating layer of the second fillers have equal thicknesses.

13. The semiconductor package of claim 9, wherein
a shape of the fillers includes at least one of a sphere, a platelet, or a fiber.

14. The semiconductor package of claim 1, wherein
the at least one semiconductor chip is electrically connected to the package substrate using solder bumps.

15. A semiconductor package comprising:
a package substrate;
at least one semiconductor chip mounted on the package substrate; and
a molding member that surrounds the at least one semiconductor chip,
the molding member including fillers,
    each of the fillers including a core and a coating layer that surrounds the core,
    the core including a non-electromagnetic material,
the coating layer including an electromagnetic material, and
    the molding member including regions that respectively have different distributions of the fillers, wherein
    the at least one semiconductor chip is electrically connected to the package substrate using solder bumps, and
    the fillers in the molding member are placed around each of the solder bumps, with a relatively high distribution in a region between the at least one semiconductor chip and the package substrate among the regions in the molding member, wherein
the molding member includes a first region and a second region,
the first region has a first concentration of the fillers,
the second region has a second concentration of the fillers that is less than the first concentration,
the second region is over the first region and extends over the at least one semiconductor chip, and
the at least one semiconductor chip is on the first region.

16. A semiconductor package comprising:
a package substrate;
at least one semiconductor chip mounted on the package substrate; and
a molding member that surrounds the at least one semiconductor chip,
the molding member including fillers,
    each of the fillers including a core and a coating layer that surrounds the core,
    the core including a non-electromagnetic material,
the coating layer including an electromagnetic material, and
    the molding member including a first region and a second region, the first region having a first concentration of the fillers, the second region having a second concentration of the fillers that is less than the first concentration, and the first region and the second region having an equal width or an equal thickness, wherein
the second region is over the first region and extends over the at least one semiconductor chip, and
the at least one semiconductor chip is on the first region.

* * * * *